(12) United States Patent
Yu et al.

(10) Patent No.: US 11,854,921 B2
(45) Date of Patent: *Dec. 26, 2023

(54) INTEGRATED CIRCUIT PACKAGE AND METHOD

(71) Applicant: Taiwan Semiconductor Manufacturing Co., Ltd., Hsinchu (TW)

(72) Inventors: Chen-Hua Yu, Hsinchu (TW); Sung-Feng Yeh, Taipei (TW); Ming-Fa Chen, Taichung (TW); Hsien-Wei Chen, Hsinchu (TW); Tzuan-Horng Liu, Longtan Township (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/872,916

(22) Filed: Jul. 25, 2022

(65) Prior Publication Data
US 2022/0359326 A1     Nov. 10, 2022

Related U.S. Application Data

(60) Continuation of application No. 17/120,859, filed on Dec. 14, 2020, now Pat. No. 11,443,995, which is a
(Continued)

(51) Int. Cl.
*H01L 23/495*     (2006.01)
*H01L 23/31*      (2006.01)
(Continued)

(52) U.S. Cl.
CPC ........ *H01L 23/3107* (2013.01); *H01L 23/481* (2013.01); *H01L 23/5226* (2013.01); *H01L 23/5384* (2013.01)

(58) Field of Classification Search
CPC .............. H01L 23/3107; H01L 23/481; H01L 23/5226; H01L 23/5384; H01L 23/3677;
(Continued)

(56) References Cited

U.S. PATENT DOCUMENTS 7,301,233 B2   11/2007   Lee et al.
8,993,380 B2   3/2015    Hou et al.
(Continued)

FOREIGN PATENT DOCUMENTS

CN   101207113 A   6/2008
CN   106684048 A   5/2017
(Continued)

*Primary Examiner* — Theresa T Doan
(74) *Attorney, Agent, or Firm* — Slater Matsil, LLP

(57) ABSTRACT

A device package includes a first die directly bonded to a second die at an interface, wherein the interface comprises a conductor-to-conductor bond. The device package further includes an encapsulant surrounding the first die and the second die and a plurality of through vias extending through the encapsulant. The plurality of through vias are disposed adjacent the first die and the second die. The device package further includes a plurality of thermal vias extending through the encapsulant and a redistribution structure electrically connected to the first die, the second die, and the plurality of through vias. The plurality of thermal vias is disposed on a surface of the second die and adjacent the first die.

20 Claims, 44 Drawing Sheets

Related U.S. Application Data division of application No. 16/185,849, filed on Nov. 9, 2018, now Pat. No. 10,867,879.

(60) Provisional application No. 62/738,790, filed on Sep. 28, 2018.

(51) Int. Cl.
*H01L 23/48* (2006.01)
*H01L 23/522* (2006.01)
*H01L 23/538* (2006.01)

(58) Field of Classification Search
CPC .......... H01L 23/49811; H01L 23/5383; H01L 23/5389; H01L 24/80; H01L 25/105; H01L 2224/08145; H01L 2224/32225; H01L 2224/94; H01L 2224/97; H01L 2924/15311; H01L 2221/68345; H01L 21/56
USPC ........................................................ 257/676
See application file for complete search history.

(56) References Cited

U.S. PATENT DOCUMENTS

| | | | |
|---|---|---|---|
| 9,281,254 | B2 | 3/2016 | Yu et al. |
| 9,299,649 | B2 | 3/2016 | Chiu et al. |
| 9,372,206 | B2 | 6/2016 | Wu et al. |
| 9,425,126 | B2 | 8/2016 | Kuo et al. |
| 9,443,783 | B2 | 9/2016 | Lin et al. |
| 9,461,018 | B1 | 10/2016 | Tsai et al. |
| 9,496,189 | B2 | 11/2016 | Yu et al. |
| 9,666,502 | B2 | 5/2017 | Chen et al. |
| 9,735,131 | B2 | 8/2017 | Su et al. |
| 9,735,134 | B2 | 8/2017 | Chen |
| 10,867,879 | B2 * | 12/2020 | Yu .................... H01L 24/19 |
| 2008/0142990 | A1 | 6/2008 | Yu et al. |
| 2008/0246126 | A1 | 10/2008 | Bowles et al. |
| 2015/0348940 | A1 | 12/2015 | Woychik et al. |
| 2017/0117253 | A1 | 4/2017 | Yu et al. |
| 2017/0133351 | A1 | 5/2017 | Su et al. |
| 2018/0005940 | A1 | 1/2018 | Chen et al. |

FOREIGN PATENT DOCUMENTS

| | | |
|---|---|---|
| CN | 106960800 A | 7/2017 |
| KR | 20170046557 A | 5/2017 |

* cited by examiner

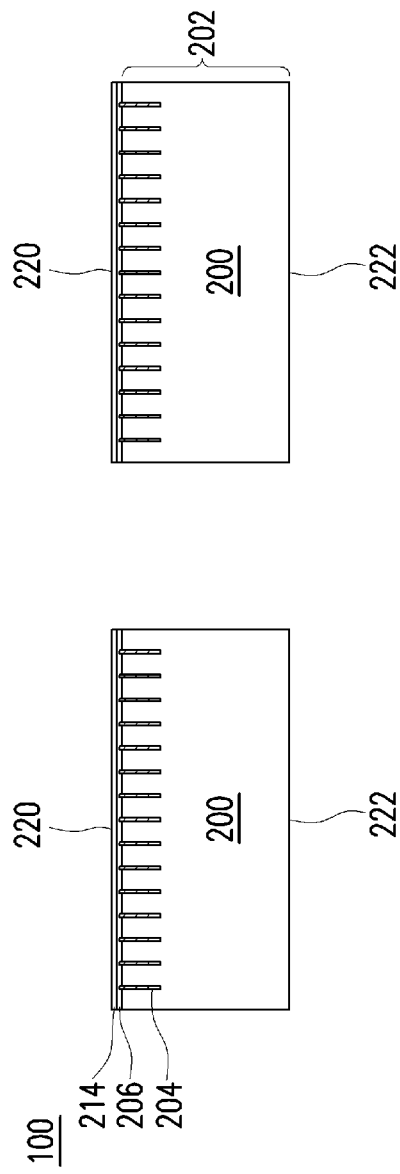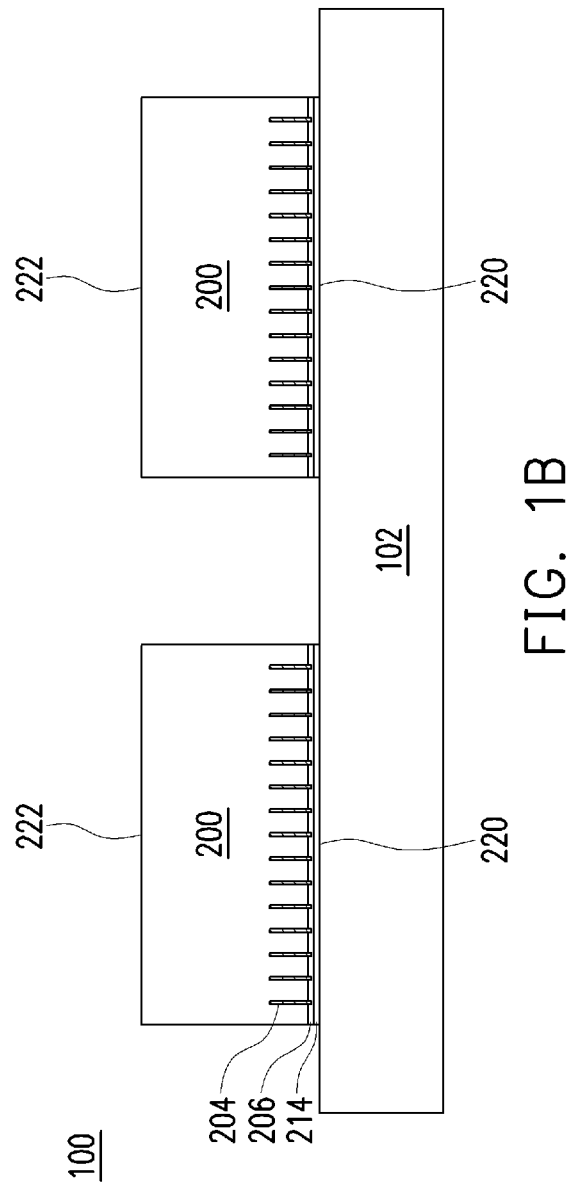

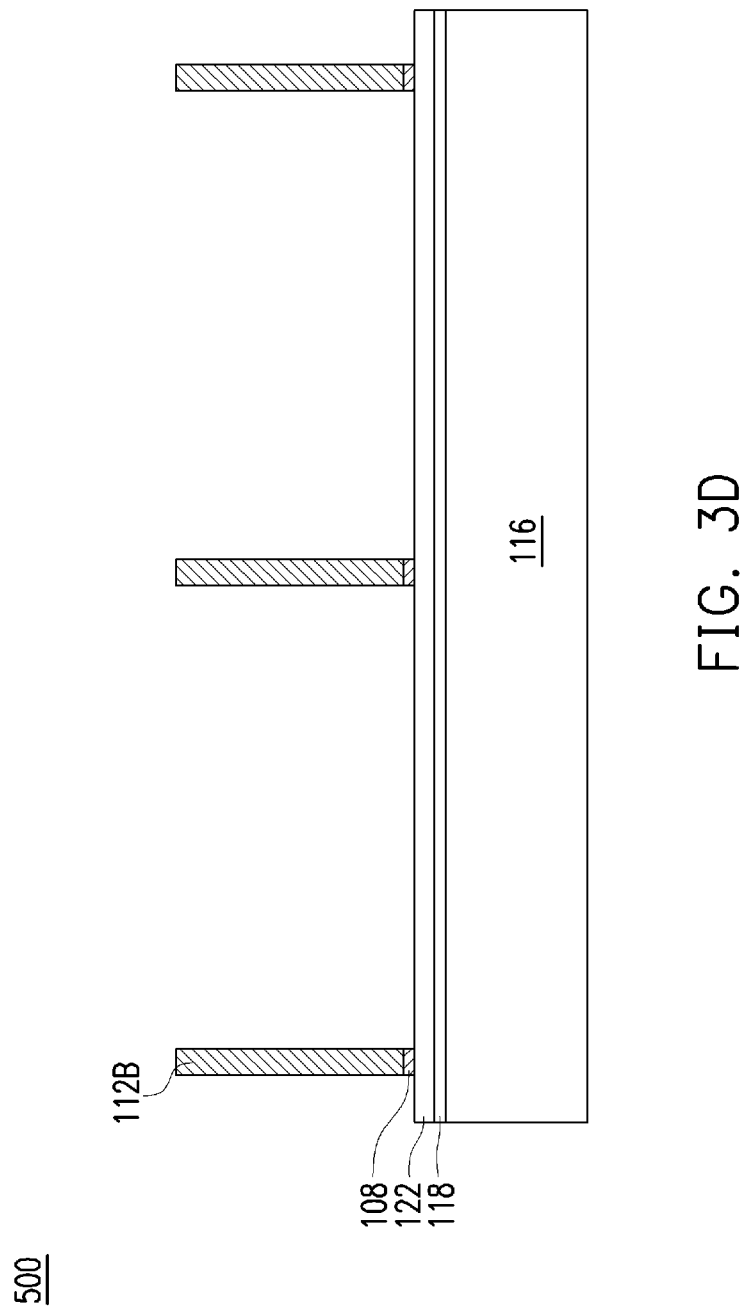

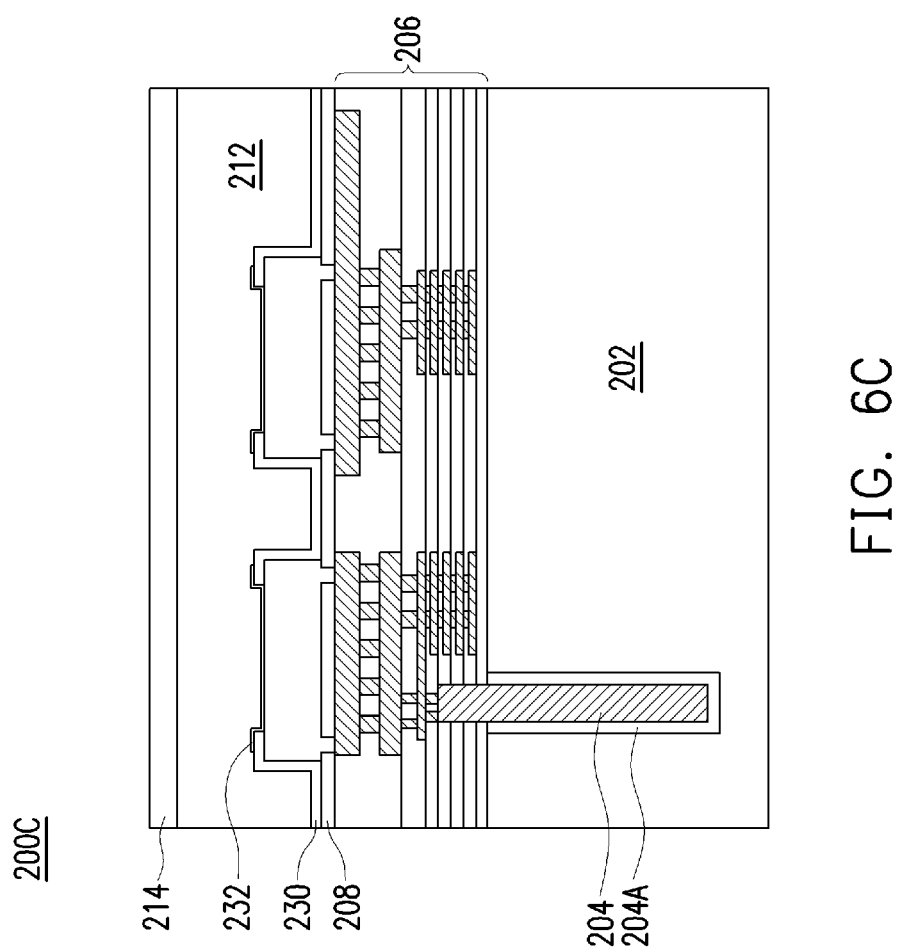

INTEGRATED CIRCUIT PACKAGE AND METHOD

PRIORITY CLAIM AND CROSS-REFERENCE

This application is a continuation of U.S. application Ser. No. 17/120,859, filed on Dec. 14, 2020, which is a divisional of U.S. application Ser. No. 16/185,849, filed on Nov. 9, 2018, now U.S. Pat. No. 10,867,879, issued Dec. 15, 2020, which claims the benefit of U.S. Provisional Application No. 62/738,790, filed on Sep. 28, 2018, which applications are hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A through 2I are cross-sectional views of intermediate steps of manufacturing a semiconductor package in accordance with some embodiments.

FIGS. 3A through 3H are cross-sectional views of intermediate steps of manufacturing a semiconductor package in accordance with some embodiments.

FIGS. 6A through 6D are cross-sectional views of intermediate steps of manufacturing a semiconductor device in accordance with some embodiments.

Throughout the figures, unless otherwise specified, like reference numerals indicate like elements formed using like processes.

DETAILED DESCRIPTION

Figure 1C:
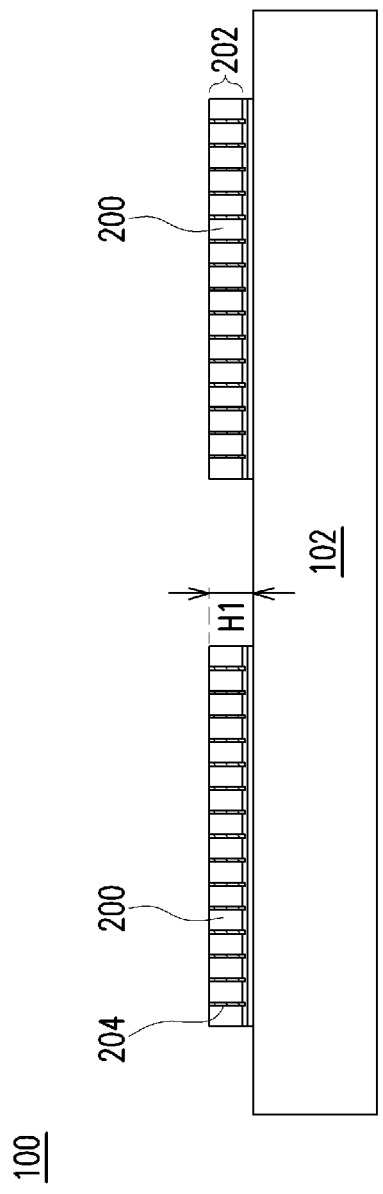
FIGS. 1A through 1O are cross-sectional views of intermediate steps of manufacturing a semiconductor package in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, stacked dies (e.g., a first die bonded to a second die) are encapsulated in an encapsulant and electrically connected to a redistribution structure to form an integrated circuit package (also referred to as a semiconductor package). Each of the dies in the package may be known good dies (KGD's), which have passed one or more chip probe (CP) tests. The first die (e.g., an application processor (AP)) may be hybrid bonded to the second die (e.g., memory). In an example hybrid bonding configuration, an insulating layer (or semiconductor layer) of the first die may be directly bonded to an insulating layer (or semiconductor layer) of the second die, and conductive bond pads of the first die are directly bonded to conductive bond pads of the second die. By hybrid bonding the first die and the second die, a thickness of the bonded structure can be reduced, and the bonded structure may be packaged within other components (e.g., other dies and/or redistribution structures) at a greater density. Further, embodiment packages may also include through vias extending from the stacked dies through the encapsulant. The through vias may be thermally conductive (e.g., providing heat dissipation through the package). Further, the through vias may or may not provide electrical connection to the stacked dies. Various embodiment packages may provide one or more of the following non-limiting advantages: cost savings by employing KGD's to detect faulty chips prior to packaging, thereby improving yield and reducing waste and/or cost; improved thermal dissipation; providing multi-die stacking of homogenous or heterogeneous die types and/or die sizes; increased flexibility in die stacking; improved signal transmission performance; and integration into wafer-to-wafer bonding processes and/or other processes for manufacturing ease and cost savings.

FIGS. 1A through 1O are cross-sectional views of intermediate steps of a process for forming a semiconductor package 100 (shown in FIG. 1O), in accordance with some embodiments.

Referring to FIG. 1A, semiconductor dies 200 are illustrated. FIG. 1F illustrates a detailed cross-sectional view of portions of an embodiment die 200 and may be referenced herein for clarity. Further, the dies 200 may have any of the die configurations as illustrated by the die 200A of FIGS. 4A-4D, the die 200B of FIGS. 5A-5D, the die 200C of FIGS. 6A-6D, or the die 200D of FIGS. 7A-7D. The dies 200 may be a bare chip semiconductor die (e.g., unpackaged semiconductor die). For example, the dies 200 may be logic dies (e.g., application processors (APs), central processing units, microcontrollers, etc.), memory dies (e.g., dynamic random access memory (DRAM) dies, hybrid memory cubes (HBCs), static random access memory (SRAM) dies, a wide input/output (wideIO) memory dies, magnetoresistive random access memory (mRAM) dies, resistive random access memory (rRAM) dies, etc.), power management dies (e.g., power management integrated circuit (PMIC) dies), radio frequency (RF) dies, sensor dies, micro-electro-mechanical-system (MEMS) dies, signal processing dies (e.g., digital signal processing (DSP) dies), front-end dies (e.g., analog front-end (AFE) dies), biomedical dies, or the like. In a specific embodiment, a surface area of the dies 200 may be about 100 mm$^2$, although in other embodiments, the dies 200 may have different dimensions.

The dies 200 may be processed according to applicable manufacturing processes to form integrated circuits in the dies 200. For example, each of the dies 200 may include a semiconductor substrate 202, such as silicon, doped or undoped, or an active layer of a semiconductor-on-insulator (SOI) substrate. The semiconductor substrate 202 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices, such as transistors, diodes, capacitors, resistors, etc., may be formed in and/or on the semiconductor substrate 202 and may be interconnected by an interconnect structure 206 comprising, for example, metallization patterns (e.g., metallization patterns 206C and 206D in FIG. 4A) in one or more dielectric layers (e.g., layers 206A and 206B in FIG. 4A) on the semiconductor substrate 202. The interconnect structures 206 and the devices on the substrate 202 form one or more integrated circuits.

The dies 200 each further include through vias 204, which may be electrically connected to the metallization patterns in the interconnect structure 206. The through vias 204 may comprise a conductive material (e.g., copper) and may extend from the interconnect structure 206 into the substrate 202. Insulating barrier layers (e.g., barrier layer 204A in FIG. 1F) may be formed around at least portions of the through vias 204 in the substrates 202. The insulating barrier layers may comprise, for example, silicon oxide, silicon nitride, silicon oxynitride, or the like, and may be used to physically and electrically isolate the through vias 204 from the substrates 202. In subsequent processing steps, the substrate 202 may be thinned to expose the through vias 204. After thinning, the through vias 204 provide electrical connection from a back side of the substrate 202 to a front side of the substrate 202.

Figure 6A:
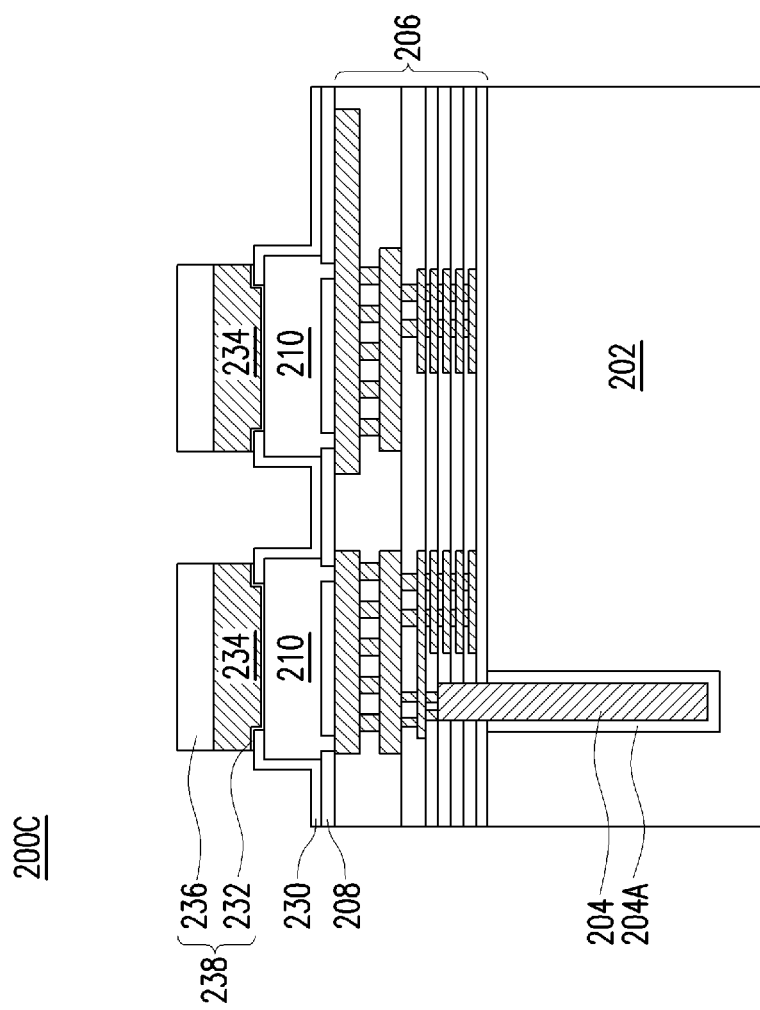
Figure 7A:
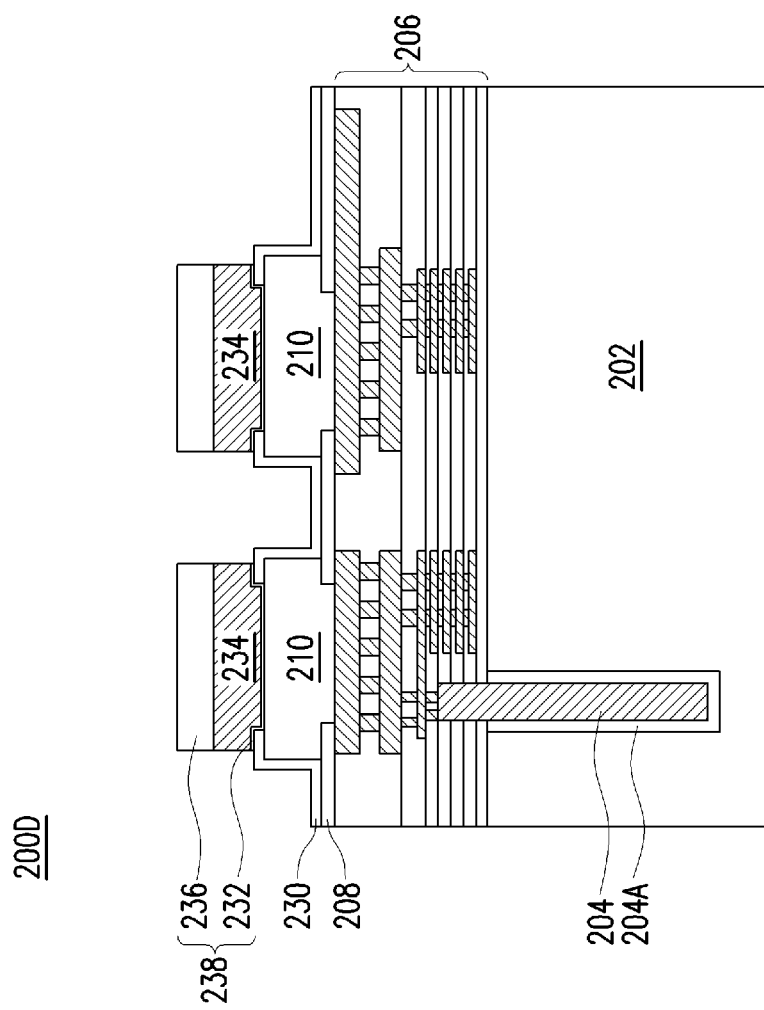
FIGS. 7A through 7D are cross-sectional views of intermediate steps of manufacturing a semiconductor device in accordance with some embodiments.

The dies 200 each further comprise contact pads (e.g., contact pads 210 in FIG. 1F) to which external connections are made to the interconnect structure 206 and the devices. The contact pads may comprise copper, aluminum (e.g., 28K aluminum), or another conductive material. In some embodiments, the contact pads may comprise a conductive pillars having a solder cap disposed thereon (e.g., conductive pillar 210A and solder cap 210B in FIG. 5A). In some embodiments, a conductive connector may be optionally formed on the contact pads (e.g., as illustrated by FIGS. 6A and 7A). In some embodiments, the contact pads have a pitch of about 90 μm (e.g., distance between adjacent contact pads) and a critical dimension (CD) of about 50 μm. The CD of the contact pads may refer to a diameter of the pads in a top-down view. Other dimensions for the contact pads are also contemplated in other embodiments. As illustrated in FIGS. 1A, 1B, and 1F, the contact pads are disposed on what may be referred to as an active side or front side 220 of the dies 200. The active side/front side 220 of the dies 200 may refer to a side of the semiconductor substrate 202 on which the active devices are formed. The back side 222 of the dies 200 may refer to a side of the semiconductor substrate opposite the active side/front side.

A passivation film (e.g., passivation film 208 in FIG. 1F) is disposed on the interconnect structure 206, and the contact pads are exposed at a top surface of the passivation film. The passivation film may comprise silicon oxide (e.g., $SiO_2$), silicon oxynitride, silicon nitride, or the like. In some embodiments, the pads, such as contact pads 210, may extend above a top surface of the passivation film.

The dies 200 may be formed as part of a larger wafer (e.g., connected to each other and other dies). Subsequently, the dies 200 may be singulated from each other and from other features of the wafer as illustrated by FIG. 1A. The singulation process may include mechanical sawing, laser dicing, plasma dicing, combinations thereof, or the like.

Figure 4A:
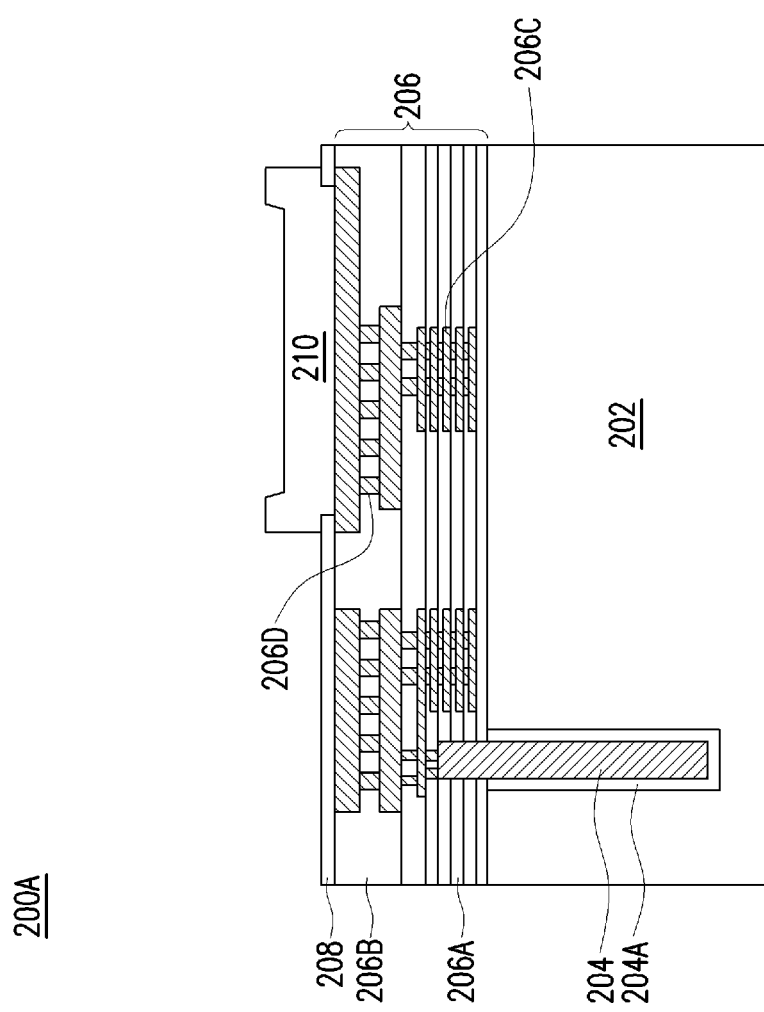
FIGS. 4A through 4D are cross-sectional views of intermediate steps of manufacturing a semiconductor device in accordance with some embodiments.

After the singulation process, a chip probe (CP) test may be applied to each of the dies 200 (e.g., using contact pads 210 in FIGS. 4A/6A or pillar 230/solder cap 232 in FIGS. 6A/7A). The CP test checks electrical functionality of the dies 200, and dies that pass the CP tests are referred to as known good dies (KGDs). Dies 200 that do not pass the CP tests are discarded or repaired. In this manner, KGDs are provided for packaging, which reduces waste and expense of packaging a faulty die.

After the CP tests, a bonding layer 214 is formed over the contact pads and the interconnect structure 206 of each KGD. The bonding layer 214 may comprise any material that is capable of forming a dielectric-to-dielectric bond. For example the bonding layer 214 may comprise silicon oxide (e.g., $SiO_2$), silicon oxynitride, silicon nitride, or the like. Conductive features (e.g., contact pads 218 in FIG. 1F, 4D, 5D, or 6C) may be disposed in the bonding layer 214 and exposed at the front surface 220 of the dies 200. The conductive features may be electrically connected to the contact pads of the dies by, for example, conductive vias (e.g., conductive vias 216 in FIG. 1F, 4D, 5D, or 6C), which extend through a dielectric layer (e.g., layer 212 in FIG. 1F). The dielectric layer may comprise tetraethyl orthosilicate (TEOS), or the like, and the dielectric layer may be provided to provide a planar surface on which to form the bonding layer 214. The bonding layer 214 and the conductive features may have any of the configurations and/or formation process discussed below in reference to FIGS. 4A-4D; FIGS. 5A-5D; FIGS. 6A-6D; or FIGS. 7A-7D. In other embodiments, the bonding layer 214 may be formed over the front surface 220 of the dies 200 without any conductive features disposed therein (e.g., as illustrated in FIG. 4C, 5C, 6C, or 7C).

In FIG. 1B, the singulated dies 200 are attached face down to a carrier substrate 102 so that multiple packages may be formed simultaneously on the carrier substrate 102. Each die may be disposed in a region having a top-down area sufficiently large to support the formation of subsequent fan-out features around and over a die 200. For example, when the dies 200 have a surface area of about 100 mm², a surface area of a region in which the die 200 is placed may be about 160 mm². Other embodiments may employ different dimensions. The carrier substrate 102 may be a glass carrier substrate, a ceramic carrier substrate, or the like. The carrier substrate 102 may be a wafer, such that multiple packages can be formed on the carrier substrate 102 simultaneously.

The dies 200 are disposed face down such that the front sides 220 of the dies 200 face the carrier substrate 102 and the back sides 222 of the dies 200 face away from the carrier substrate 102. In some embodiments, the dies 200 are attached to the carrier substrate 102 by a release layer, and the bonding layer 214 of the dies 200 may contact the release layer. The release layer may be formed of a polymer-based material, which may be removed along with the carrier substrate 102 from the dies 200 and other overlying structures that will be formed in subsequent steps. In some embodiments, the release layer is an epoxy-based thermal-release material, which loses its adhesive property when heated, such as a light-to-heat-conversion (LTHC) release coating. In other embodiments, the release layer may be an ultra-violet (UV) glue, which loses its adhesive property when exposed to UV lights. The release layer may be dispensed as a liquid and cured, may be a laminate film laminated onto the carrier substrate 102, or may be the like. The top surface of the release layer may be leveled and may have a high degree of planarity. In other embodiments, the dies 200 may be fusion bonded to the carrier 102, for example, by fusion bonding the bonding layer 214 to the carrier 102. The fusion bonding may form a dielectric-to-semiconductor bond between the bonding layer 214 and the carrier 102.

In FIG. 1C, a thinning process may be applied to the dies 200 to expose the through vias 204. The thinning removes portions of the substrates 202 over the through vias 204. In some embodiments, the thinning may further remove lateral portions of a barrier layer on the through vias 204 to expose the through vias 204. The thinning process may comprise performing a chemical mechanical polish (CMP), grinding, an etch back (e.g., a wet etch) or the like. After thinning, a height H1 of the dies 200 may 20 μm or less. By thinning the dies 200 to this height, improvements in device density and electrical performance can be observed in the completed package 100.

Figure 1D:
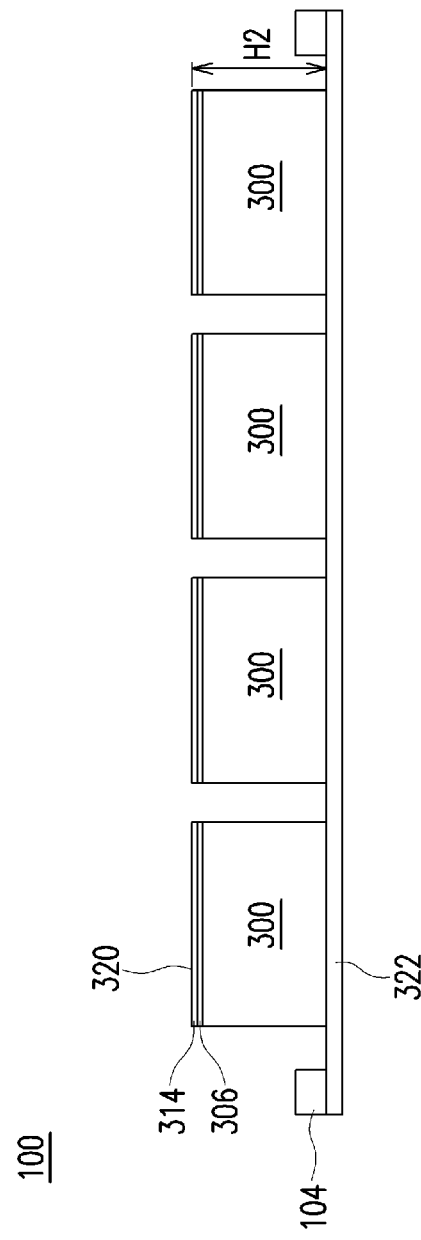

FIG. 1D illustrates a plurality of semiconductor dies 300 on a die tape 104. FIG. 1F illustrates a detailed view of a portion of the dies 300. The dies 300 may have a structure similar to what is described for the dies 200, and the details are not repeated herein. The materials of the features in the dies 300 may be found by referring to the like features in the dies 200, with the like features in the dies 200 starting with number "2," which features correspond to the features in the dies 300 and having reference numerals starting with number "3." In a specific embodiment, the dies 300 are memory dies, but other types of dies may be used as well.

The dies 300 may be formed as part of a larger wafer (e.g., connected to each other and other dies 300). After various features are formed in the dies 300, a thinning process may be applied to thin the dies 300 to a height H2. For example, in a specific embodiment, the dies 300 may be thinned from an initial height of about 780 μm or more to a height of about 160 μm or less. By thinning the dies 300 to this height, improvements in device density and electrical performance can be observed in the completed package 100. Further, the dies 300 are thicker during the formation of various features in order to provide adequate physical support to the features during formation.

Subsequently, the dies 300 may be singulated from each other and from other features of the wafer as illustrated by FIG. 1D. The singulation process may include mechanical sawing, laser dicing, plasma dicing, combinations thereof, or the like.

After the singulation process, a chip probe (CP) test may be applied to each of the dies 300 using pads of the dies 300 (e.g., pads 310 in FIG. 1F). The CP test checks electrical functionality of the dies 300 to identify KGDs. Dies 300 that do not pass the CP tests are discarded or repaired. In this manner, KGDs are provided for packaging, which reduces waste and expense of packaging a faulty die.

After the CP tests, a bonding layer 314 is formed over the pads and the interconnect structure 306 of each KGD. The bonding layer 314 may by similar to the bonding layer 214. Conductive features (e.g., contact pads 318 in FIG. 1F) may be disposed in the bonding layer 314 and exposed at the front surface 320 of the dies 300. The conductive features may be electrically connected to the pads of the dies by, for example, conductive vias (e.g., conductive vias 316 in FIG. 1F), which extend through a dielectric layer (e.g., layer 312 in FIG. 1F). The dielectric layer may comprise TEOS, or the like, and the dielectric layer may be provided to provide a planar surface on which to form the bonding layer 314. FIG. 1F illustrates the dies 300 having a bonding layer 314 formed using similar methods as those discussed below in reference to FIGS. 4A-4D. In other embodiments, the bonding layer 314 of the dies 300 maybe processed using a different method, such as, those discussed below in reference to FIGS. 5A-5D; 6A-6D; or FIGS. 7A-7D.

Figure 1E:
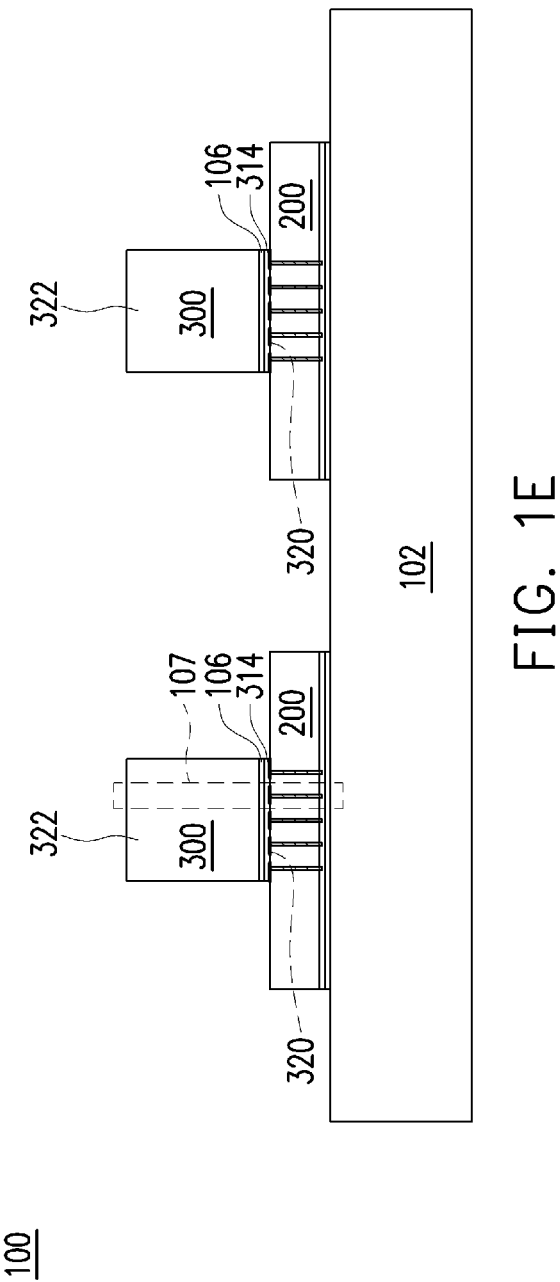
Figure 1F:
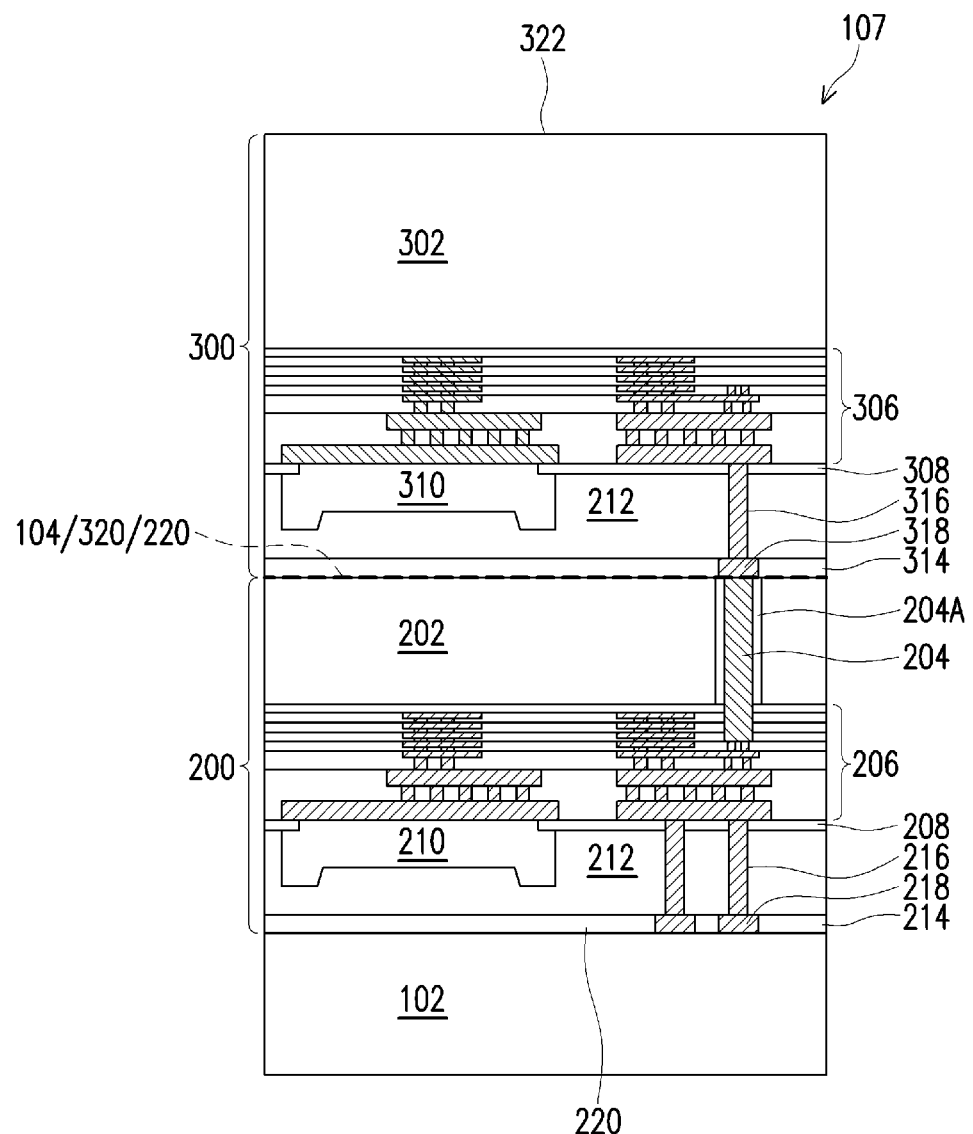

In FIG. 1E, the dies 300 are bonded to the dies 200, for example, in a hybrid bonding configuration. The dies 300 are disposed face down such that the front sides 320 of the dies 300 face the dies 200 and the back sides 322 of the dies 300 face away from the dies 200. The dies 300 are bonded to the dies 200 at an interface 106. The dies 300 may have smaller surface area than the dies 200. For example, in an embodiment where a respective surface area of the dies 200 is about 100 mm², each of the dies 300 may have a surface area of 30 mm². Other embodiments may employ other dimensions. The dies 200 extend laterally past the dies 300, and portions of the back sides 222 of the dies 200 are exposed after bonding of the dies 200 and 300. By leaving a portion of the back sides 222 of the dies 200 exposed, thermal vias (e.g., thermal vias 112A, see FIG. 1I) may be formed on the back sides 222 of the dies 200 in subsequent process steps.

FIG. 1F illustrates a detailed view of a region 107 of the dies 200 bonded to the dies 300. Although FIG. 1F illustrates the dies 200 as having the conductive vias 216 and the contact pads 218, these features are optional and may be excluded such that the bonding layer 214 is free of conductive materials formed therein (e.g., as illustrated by FIG. 4C, 5C, 6C, or 7C). As illustrated by FIG. 1F, the hybrid bonding process directly bonds the layer 314 of the die 300 to the semiconductor substrate 202 of the die 200 at the interface 104 through fusion bonding. In an embodiment, the bond between the substrate 202 and the bonding layer 314 may be an oxide-to-semiconductor bond or an oxide-to-oxide bond (e.g., utilizing a native oxide layer at the backside 322 of the substrate 202 or an oxide layer deposited on the backside 322 of the substrate 202). The hybrid bonding process further directly bonds the contact pads 318 of the die 300 to the though vias 204 of the dies 200 at the interface 106 through direct metal-to-metal bonding. Thus, electrical connection can between the dies 200 and 300 is provided by the physical connection of the contact pads 318 to the through vias 204.

As an example hybrid bonding process starts with aligning the dies 200 with the dies 300, for example, by aligning the contact pads 318 to the through vias 204. When dies 200 and 300 are aligned, the contact pads 318 may overlap with the corresponding through vias 204. Next, the hybrid bonding includes a pre-bonding step, during which each die 200 is put in contact with a respective die 300. The hybrid bonding process continues with performing an anneal, for example, at a temperature between about 150° C. and about 400° C. for a duration between about 0.5 hours and about 3 hours, so that the copper in contact pads 318 and the though vias 204 inter-diffuses to each other, and hence the direct metal-to-metal bonding is formed.

Figure 1G:
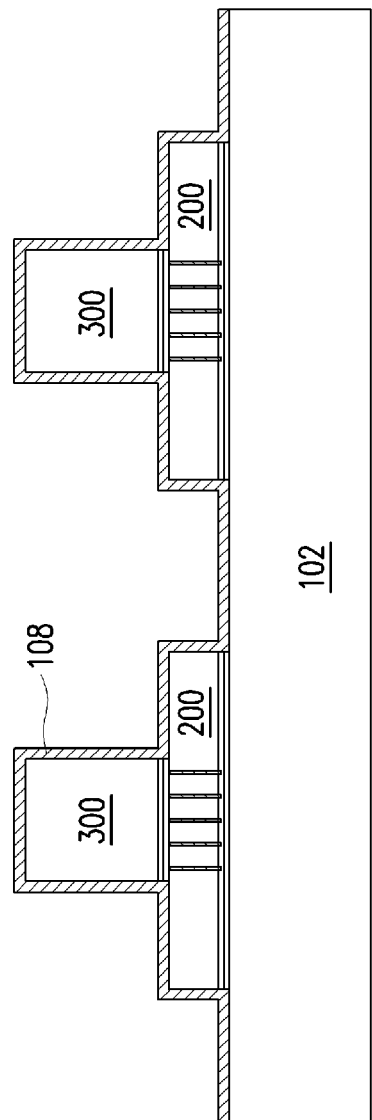

In FIG. 1G, a seed layer 108 is formed over exposed surfaces and sidewalls of the dies 200, the dies 300, and the carrier 102. In some embodiments, the seed layer 108 is a metal layer, which may be a single layer or a composite layer comprising a plurality of sub-layers formed of different materials. In some embodiments, the seed layer 108 comprises a titanium layer and a copper layer over the titanium layer. In an embodiment, the seed layer 108 comprises 0.5KÅ titanium layer and a 3KÅ thick copper layer. The seed layer 108 may be formed using, for example, PVD or the like.

Figure 1H:
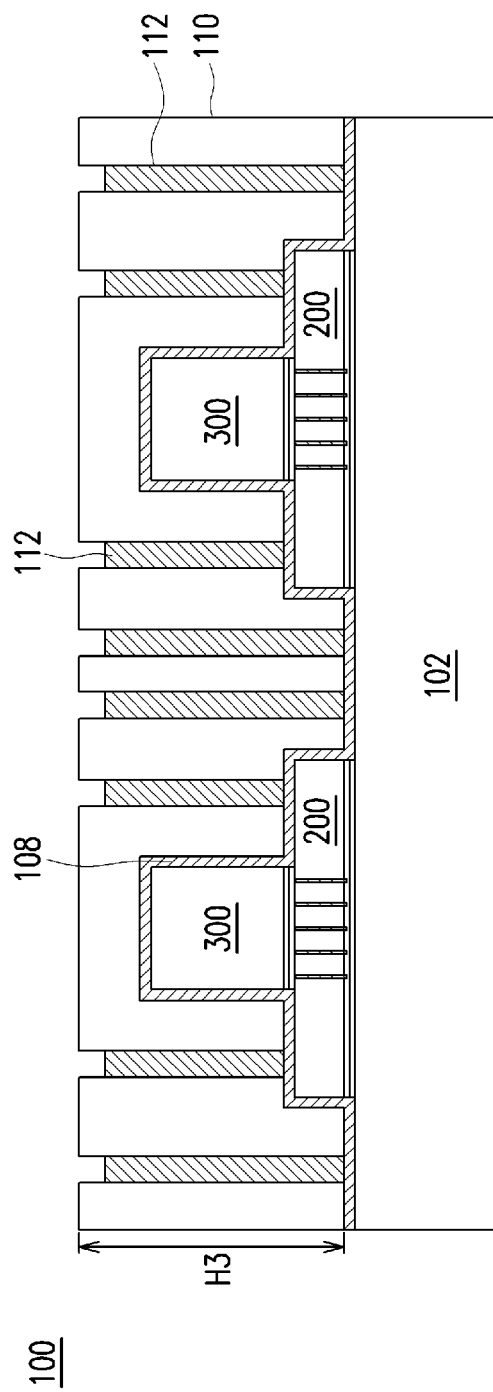

In FIG. 1H, a photoresist 110 (e.g., a dry film) is then formed and patterned on the seed layer 108. The photoresist 110 may be formed by spin coating or the like and may be exposed to light for patterning. In an embodiment, the dry film is deposited to a height H3 of about 240 μm or more in order to provide adequate support for subsequently formed conductive features. The pattern of the photoresist 110 corresponds to the thermal vias 112A and the through vias 112B (see FIGS. 1I and 1J). The patterning forms openings through the photoresist 110 to expose the seed layer 108.

As further illustrated in FIG. 1H, a conductive material 112 is formed in the openings of the photoresist 110 and on the exposed portions of the seed layer 108. The conductive material 112 may be formed by plating, such as electroplating or electroless plating, or the like. The conductive material 112 may comprise a metal, like copper, titanium, tungsten, aluminum, or the like.

Figure 1I:
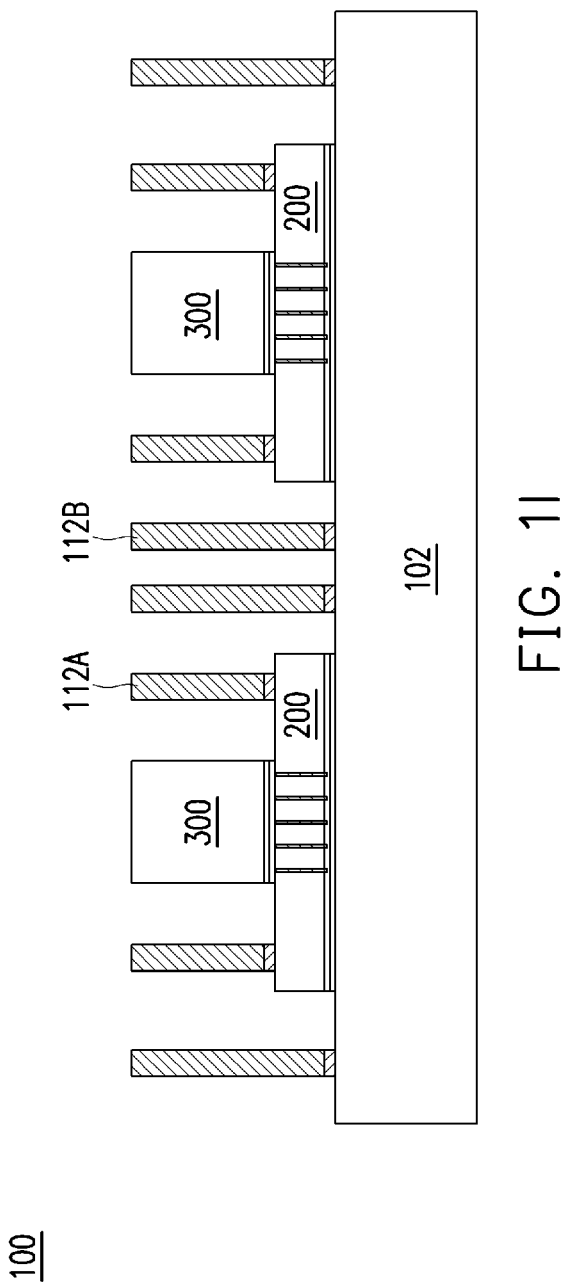

Then, in FIG. 1I, the photoresist 110 and portions of the seed layer 108 on which the conductive material 112 is not formed are removed. The photoresist 110 may be removed by an acceptable ashing or stripping process, such as using an oxygen plasma or the like. Once the photoresist 110 is removed, exposed portions of the seed layer 108 are removed, such as by using an acceptable etching process, such as by wet or dry etching. The remaining portions of the seed layer 108 and the conductive material 112 form the thermal vias 112A and the through vias 112B. Specifically, the thermal vias 112A are formed on a top surface of the dies 200, and the through vias 112B are formed adjacent the dies 200 (e.g., directly on a top surface of the carrier 102). In some embodiments, a pitch of the thermal vias 112A (e.g., a spacing between adjacent thermal vias) may be about 70 μm, and a CD of the thermal vias 112A may be about 50 μm. The CD of the thermal vias 112A may refer to a width of the thermal vias 112A in a top-down view. Other dimensions as also possible.

Figure 1J:
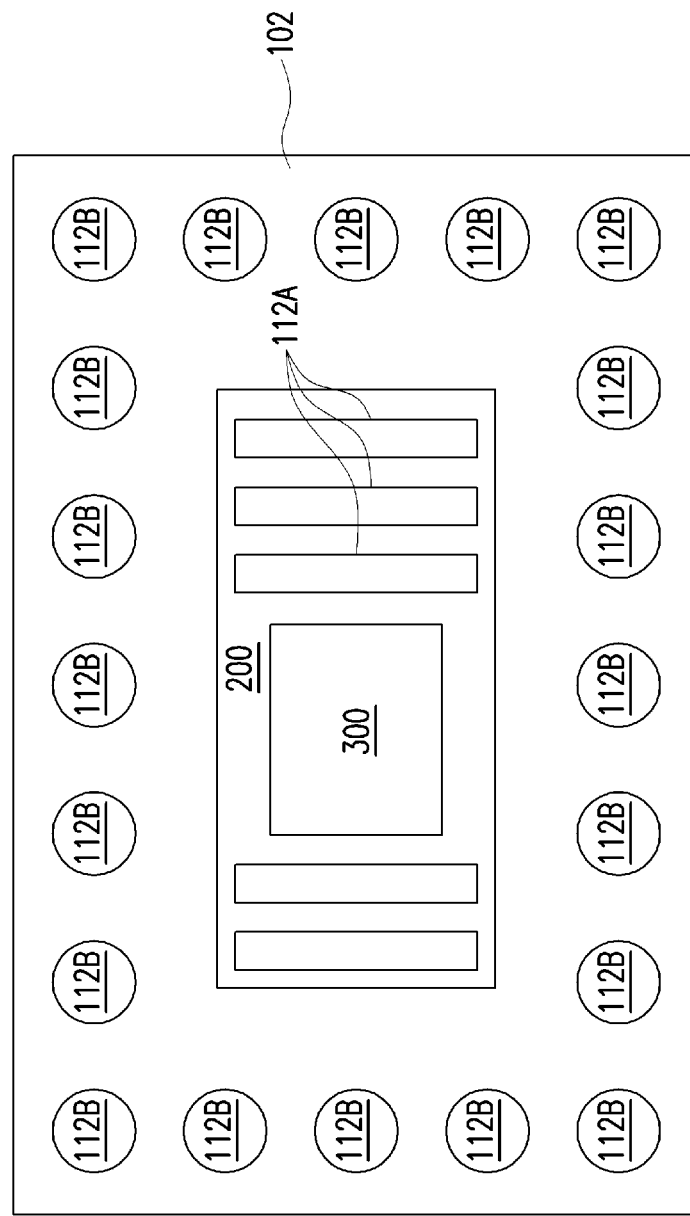

FIG. 1J illustrates a planar view of the thermal vias 112A and the through vias 112B. The thermal vias 112A and the through vias 112B may have a different shape. For example, the thermal vias 112A may be elongated (e.g., rectangular) in order to increase a surface area of the thermal vias 112A. In some embodiments, the thermal vias may extend laterally past sidewalls of and be longer than the dies 300 in at least one direction. In the completed package 100, the thermal vias 112A are used to dissipate heat away from the dies 200, and thus, increased surface area may advantageously increase a heat dissipation ability of the thermal vias 112A. The through vias 112B may have circular shapes in a top down view and surround a periphery of the dies 200. The through vias 112B may be used to transmit signals in the completed package 100, and thus a smaller surface area may be beneficial to increase density and improve signal routing abilities. It should be appreciated that the thermal vias 112A and/or the through vias 112B may have different shapes in other embodiments. In some embodiments, the thermal vias 112A are electrically isolated from any active devices in the dies 200 and 300, and the thermal vias 112A may not be used for electrical routing. In such embodiments, the thermal vias 112A may be referred to as dummy features. In other embodiments, the thermal vias 112A may be electrically connected to active devices in the dies 200, and the thermal vias 112A may be used for electrical routing.

Figure 1K:
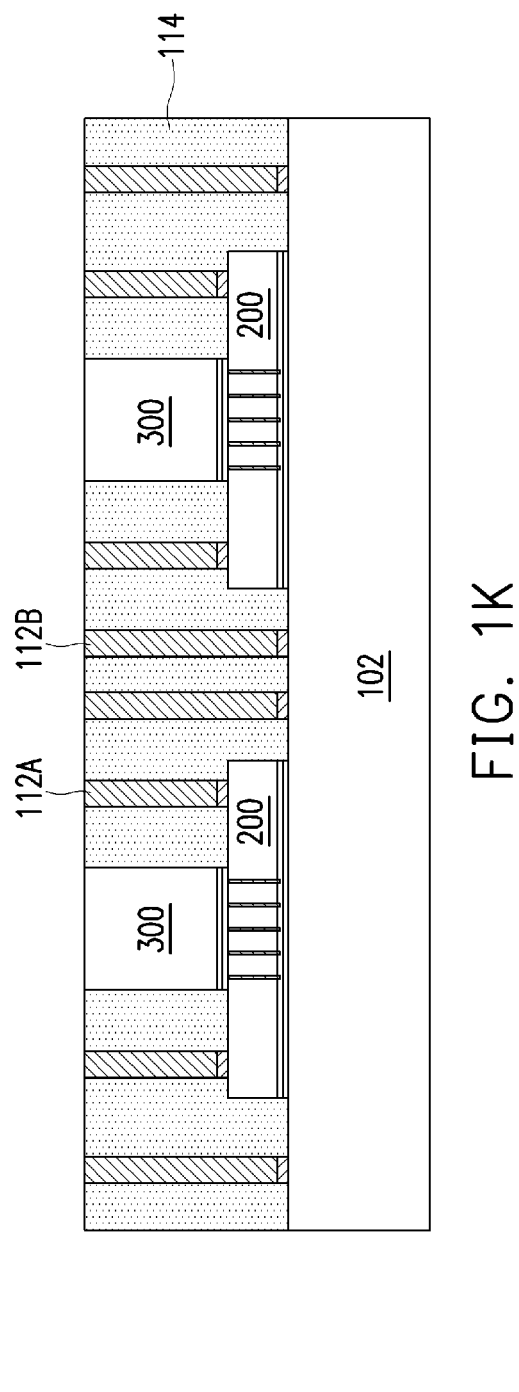

In FIG. 1K, an encapsulant 114 is formed on the various components. The encapsulant 114 may be a molding compound, epoxy, or the like, and may be applied by compression molding, transfer molding, or the like. The encapsulant 114 is dispensed around the through vias 112B, the thermal vias 112A, the dies 200, and the dies 300. In an embodiment, the encapsulant 114 is dispensed in liquid form. The encapsulant 114 is then cured, and may optionally be planarized by, e.g., a grinding or chemical-mechanical polish (CMP) process. After planarization, top surfaces of the encapsulant 114, the dies 300, the thermal vias 112A, and the through vias 112B are substantially level. The thermal vias 112A provide heat dissipation from surfaces of the dies 200 through the encapsulant 114, and the through vias 112B provide an electrical path between opposing surfaces of the encapsulant 114.

Figure 1L:
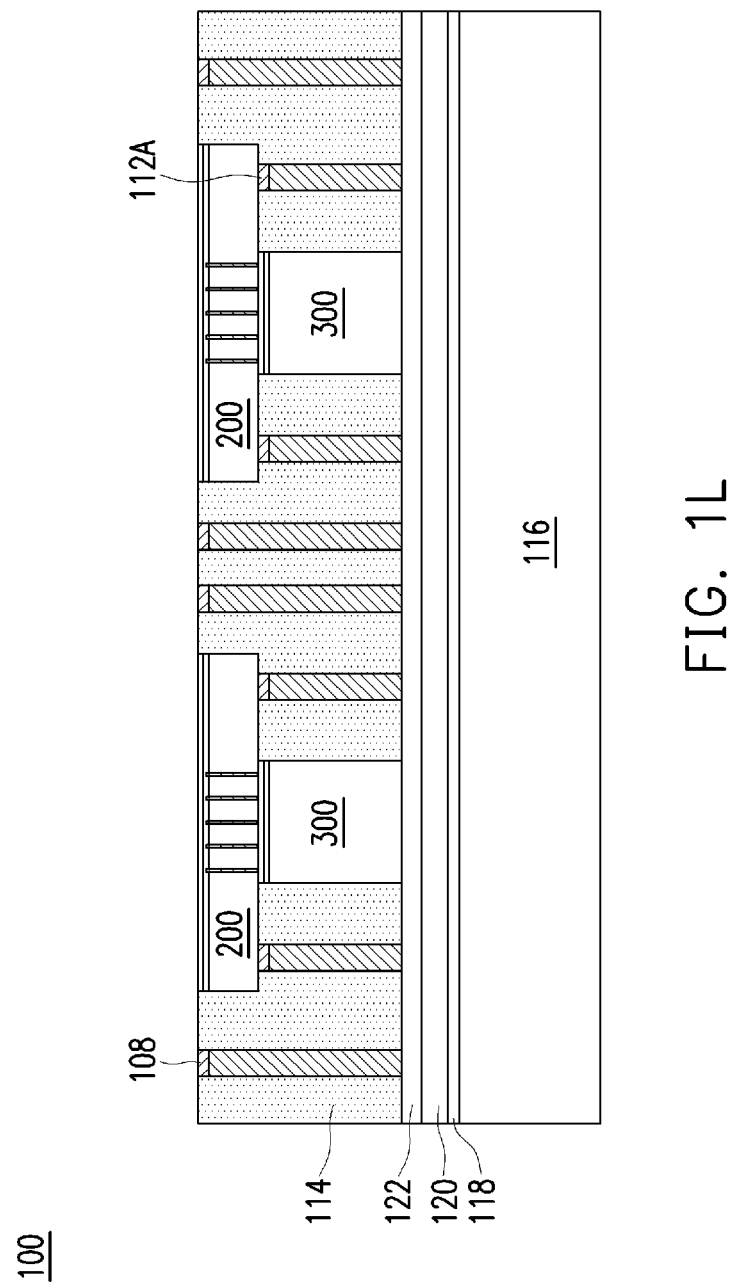
Figure 1M:
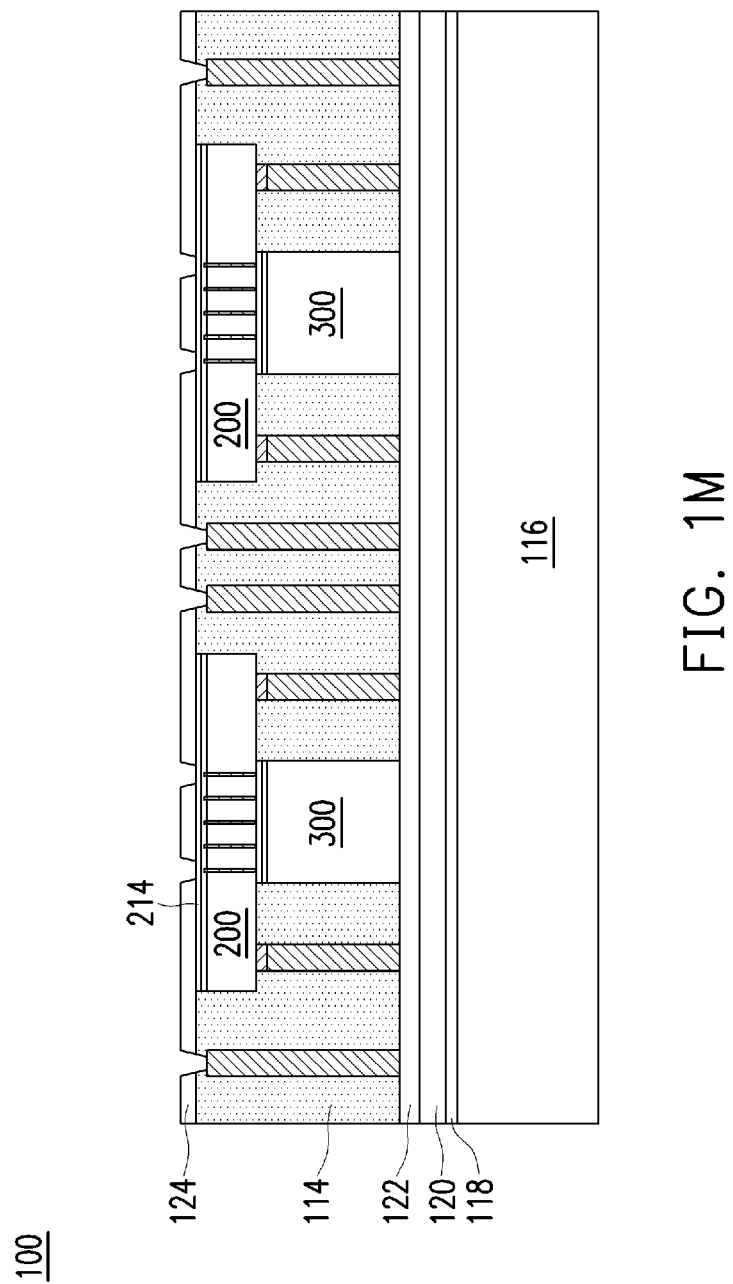

After the encapsulant 114 is formed, a dielectric layer 122 may be deposited on the encapsulant 114, the thermal vias 112A, the through vias 112B, and the dies 300 as illustrated by FIG. 1L. In some embodiments, the dielectric layer 122 is formed of a photo-sensitive material such as polybenzoxazole (PBO), polyimide, benzocyclobutene (BCB), or the like, which may be patterned using a lithography mask. The dielectric layer 122 may be formed by spin coating, lamination, CVD, the like, or a combination thereof. In some embodiments, a thickness of the dielectric layer 122 may be about 7 μm or less, although the dielectric layer 122 may have a different dimension in other embodiments. By having a dielectric layer 122 in this range, increased density can be achieved of stacked features.

After the dielectric layer 122 is deposited, a carrier substrate 116 may be attached to an opposing side of the dielectric layer 122 as the dies 200 and 300. To attach the carrier substrate 116, various features of the partially manufactured package 100 may be flipped over such that the encapsulant 114, the dies 200/300, the thermal vias 112A, and the through vias 112B are disposed over the dielectric layer 122 and the carrier substrate 116.

The carrier substrate 116 may be similar to the carrier substrate 102 described above. In some embodiments, the carrier substrate 102 and the carrier substrate 116 may be different. For example, the carrier substrate 102 may be a silicon substrate, and the carrier substrate 116 may be a glass substrate, such as, a glass substrate having a coefficient of thermal expansion (CTE) of about 7.2. A thickness of the carrier substrate 116 may be about 1000 μm or more to provide sufficient support for the features disposed thereon.

The carrier substrate 116 may be attached to the dielectric layer 122 by one or more adhesive layers, such as, a die attach film (DAF) 120 and a light to heat conversion (LTHC) film 118. In some embodiments, the LTCH film 118 may have a transmittance of about 1% and a thickness of about 1 μm to allow ease of attachment and subsequent removal of the carrier substrate 116. As further illustrated by FIG. 1L, after the carrier substrate 116 is attached, the carrier substrate 102 may be removed. Removal of the carrier substrate 102 may be performed using any suitable process, such as, by grinding, wet etch, dry etch, combinations thereof, or the like.

In FIG. 1L, the conductive through vias 112B are recessed, for example, by removing portions of seed layer 108 (see FIG. 1K) remaining in the through vias 112B. Removing portions of seed layer 108 may be accomplished using any suitable process, such as, dry etching, a post laser dry clean (PLDC), combinations thereof or the like. While removing portions of the seed layer 108, a patterned mask 124 may be disposed over the encapsulant 114 and the dies 200. The patterned mask 124 protects areas of the encapsulant 114 and the die 200 while removing the seed layer 108 to expose the underlying conductive material (e.g., copper) of the through vias 112B. In some embodiments, the through vias 112B have a pitch of about 300 μm (e.g., distance between adjacent through vias 112B) and a CD of about 190 μm. The CD of the through vias 112B may refer to a diameter of the through vias 112B in a top-down view. Other dimensions for the through vias 112B are also contemplated in other embodiments. Removing portions of the seed layer 108 may leave a top surface of the through vias 112B disposed lower than a top surface of the molding compound 114.

In some embodiments, the patterned mask 124 may further expose areas of the dies 200 for patterning. For example, in some embodiments a dry etching process may be used to pattern the bonding layer 214 and form openings exposing contact pads of the dies 200 disposed under the bonding layer 214 (e.g., contact pads 210, see FIG. 1F). The contact pads underlying the bonding layer 214 may be exposed particularly in embodiments where the bonding layer 214 is free of any conductive features formed therein, such as, when the contact pads 218 (see FIG. 1F) are not formed in the bonding layer 214. In other embodiments when contacts (e.g., contact pads) are formed in the bonding layer 214, the patterned mask 124 may not expose any areas of the bonding layer 214, and the bonding layer 214 is not patterned to expose any underlying contact pads. After the through vias 112B and (optionally) contact pads underlying the bonding layer 214 are exposed, the mask layer 124 may be removed.

Figure 1N:
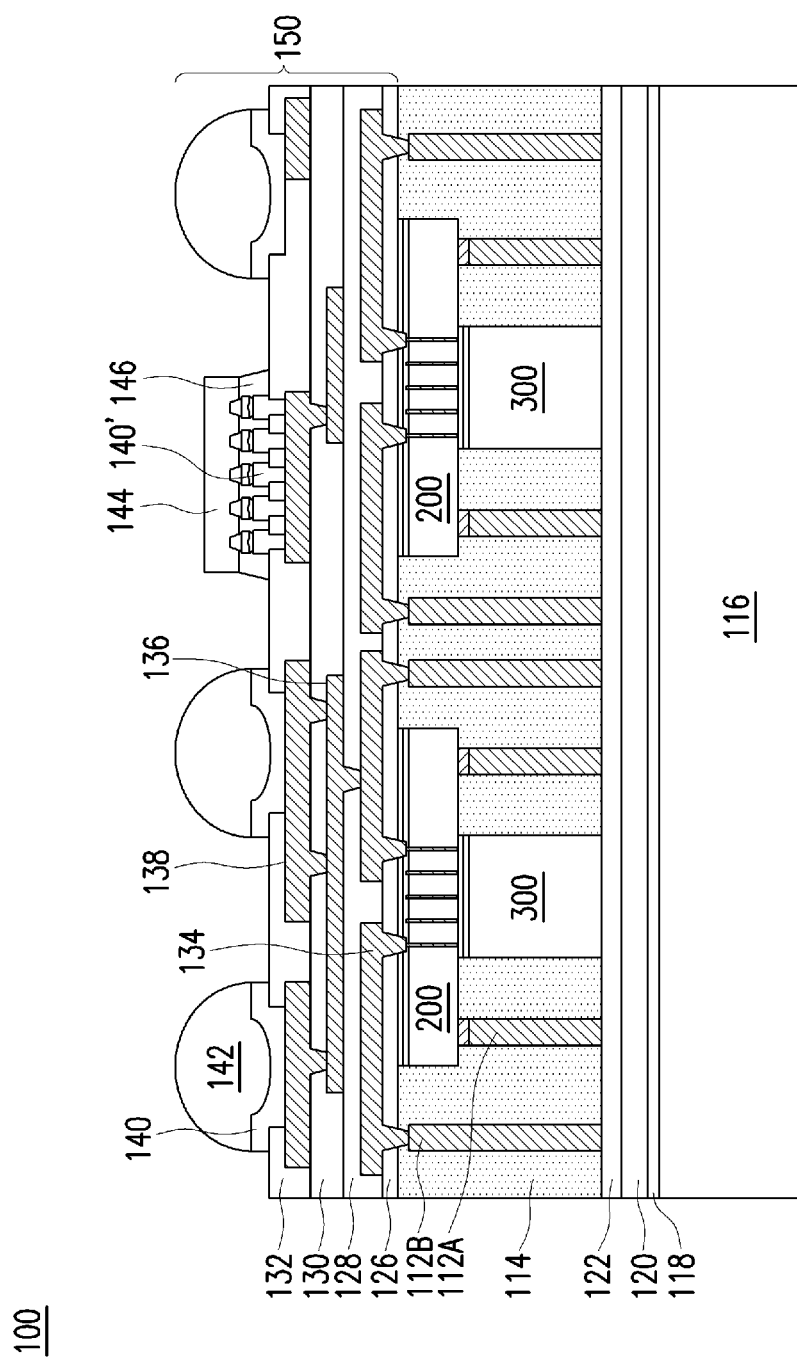
Figure 10:
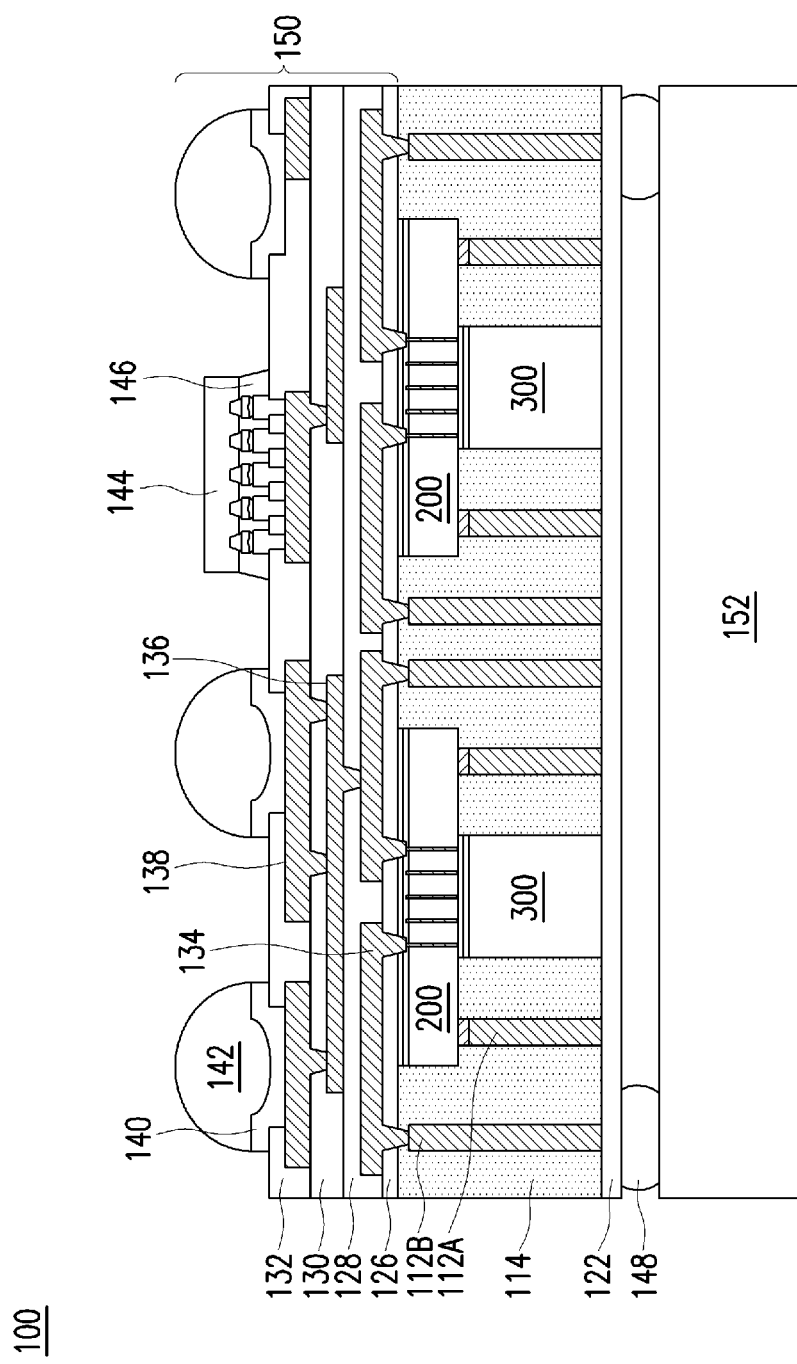

In FIG. 1N, a redistribution structure 150 is formed over the molding compound 114, the through vias 112B, and the bonded dies 200/300. The redistribution structure 150 includes dielectric layers 126, 128, 130, and 132; metallization patterns 134, 136, and 138; and under bump metallurgies (UBMs) 140. The metallization patterns may also be referred to as redistribution layers or redistribution lines. The redistribution structure 150 is shown as an example. More or fewer dielectric layers and metallization patterns may be formed in the first redistribution structure 150. If fewer dielectric layers and metallization patterns are to be formed, steps and process discussed below may be omitted. If more dielectric layers and metallization patterns are to be formed, steps and processes discussed below may be repeated.

As an example to form the redistribution structure 150, the dielectric layer 126 is deposited on the molding compound 114, the through vias 112B, and the bonding layer of the dies 200. In some embodiments, the dielectric layer 126 is formed of a photo-sensitive material such as polybenzoxazole (PBO), polyimide, benzocyclobutene (BCB), or the like, which may be patterned using a lithography mask. The dielectric layer 126 may be formed by spin coating, lamination, CVD, the like, or a combination thereof. The dielectric layer 126 may be deposited to a sufficient thickness suitable for providing insulation for overlying metallization patterns. For example, in an embodiment, the dielectric layer 126 may have a thickness of about 5 μm. Other thicknesses are also possible. The dielectric layer 126 is then patterned. The patterning forms openings exposing portions of the through vias 112B and contacts of the dies 200 (e.g., contact pads 318, if present, contact pads 210, or the like, see FIG. 1F). The patterning may be by an acceptable process, such as by exposing the dielectric layer 126 to light when the dielectric layer 126 is a photo-sensitive material or by etching using, for example, an anisotropic etch. If the dielectric layer 126 is a photo-sensitive material, the dielectric layer 126 can be developed after the exposure.

The metallization pattern 134 is then formed. The metallization pattern 134 is electrically connected to the through vias 112B, and contacts (e.g., contact pads 318, if present, contact pads 210, or the like, see FIG. 1F) of the die 200. TSVs in each die 200 provide electrical connection through the die 200 to respective the dies 300. The metallization pattern 134 includes conductive lines on and extending along the major surface of the dielectric layer 126. The metallization pattern 134 further includes conductive vias extending through the dielectric layer 126. To form the metallization pattern 134, a seed layer is formed over the dielectric layer 126 and in the openings extending through the dielectric layer 126. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD, or the like. A photo resist is then formed and patterned on the seed layer. The photo resist may be formed by spin coating or the like and may be exposed to light for patterning. The pattern of the photo resist corresponds to the metallization pattern 134. The patterning forms openings through the photo resist to expose the seed layer. A conductive material is then formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern 134. The photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching.

The dielectric layer 128 is deposited on the metallization pattern 134 and dielectric layer 126. The dielectric layer 128 may be formed in a manner similar to the dielectric layer 126, and may be formed of the same material as the dielectric layer 126. The dielectric layer 128 may be deposited to a sufficient thickness suitable for providing insulation for overlying metallization patterns and underlying metallization patterns. In some embodiments, the dielectric layer 128 is thicker than the dielectric layer 126 in order to allow the dielectric layer 128 to accommodate the metallization pattern 134. For example, in an embodiment, the dielectric layer 128 may have a thickness of about 7 µm. Other thicknesses are also possible.

The metallization pattern 136 is then formed. The metallization pattern 136 includes conductive lines on and extending along the major surface of the dielectric layer 128. The metallization pattern 136 further includes conductive vias extending through the dielectric layer 128 to be physically and electrically connected to the metallization pattern 134. The metallization pattern 136 may be formed in a manner similar to the metallization pattern 134, and may be formed of the same material as the metallization pattern 136.

The dielectric layer 130 is deposited on the metallization pattern 136 and dielectric layer 128. The dielectric layer 130 may be formed in a manner similar to the dielectric layer 126, and may be formed of the same material as the dielectric layer 126. The dielectric layer 130 may be deposited to a sufficient thickness suitable for providing insulation for overlying metallization patterns and underlying metallization patterns. In some embodiments, the dielectric layer 130 is thicker than the dielectric layer 126 in order to allow the dielectric layer 130 to accommodate the metallization pattern 136. For example, in an embodiment, the dielectric layer 130 may have a thickness of about 7 µm. Other thicknesses are also possible.

The metallization pattern 138 is then formed. The metallization pattern 138 includes conductive lines on and extending along the major surface of the dielectric layer 130. The metallization pattern 138 further includes conductive vias extending through the dielectric layer 130 to be physically and electrically connected to the metallization pattern 136. The metallization pattern 138 may be formed in a manner similar to the metallization pattern 134, and may be formed of the same material as the metallization pattern 134.

Thicknesses of each of the metallization pattern 134, 136, and 138 may be the same or different as other metallization patterns 134, 136, and 138. In an embodiment, the metallization pattern 138 may be thicker than the metallization patterns 136 and 134. For example, a thickness of the metallization pattern 138 may be about 5 µm, and each of the metallization patterns 136 and 134 may have a thickness of about 4 µm. Other thicknesses are also possible. A thickness of each of the metallization patterns 134, 136, and 138 may further correspond to a function of a respective metallization pattern 134, 136, and 138. For example, metallization patterns providing power and/or ground lines may be thicker than metallization patterns providing signal routing.

The dielectric layer 132 is deposited on the metallization pattern 138 and dielectric layer 130. The dielectric layer 132 may be formed in a manner similar to the dielectric layer 126, and may be formed of the same material as the dielectric layer 126. The dielectric layer 132 may be deposited to a sufficient thickness suitable for providing insulation for overlying UBMs and underlying metallization patterns. In some embodiments, the dielectric layer 132 is thicker than the dielectric layer 130 and 126 in order to allow the dielectric layer 132 to accommodate the metallization pattern 138 and the UBMs 140. For example, in an embodiment, the dielectric layer 132 may have a thickness of about 8 µm. Other thicknesses are also possible.

The UBMs 140 are formed on and extending through the dielectric layer 132. As an example to form the UBMs 140, the dielectric layer 132 may be patterned to form openings exposing portions of the metallization pattern 138. The patterning may be by an acceptable process, such as by exposing the dielectric layer 132 to light when the dielectric layer 132 is a photo-sensitive material or by etching using, for example, an anisotropic etch. If the dielectric layer 132 is a photo-sensitive material, the dielectric layer 132 can be developed after the exposure. The openings for the UBMs 140 may be wider than the openings for the conductive via portions of the metallization patterns 134, 136, and 138. A seed layer is formed over the dielectric layer 132 and in the openings. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the UBMs 140. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the UBMs 140. In embodiments where the UBMs 140 are formed differently, more photoresist and patterning steps may be utilized.

Conductive connectors 142 are formed on the UBMs 140. The conductive connectors 142 may be BGA connectors, solder balls, metal pillars, controlled collapse chip connection (C4) bumps, micro bumps, electroless nickel-electroless palladium-immersion gold technique (ENEPIG) formed bumps, or the like. The conductive connectors 142 may include a conductive material such as solder, copper, aluminum, gold, nickel, silver, palladium, tin, the like, or a combination thereof. In some embodiments, the conductive connectors 142 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes. In another embodiment, the conductive connectors 142 are metal pillars (such as a copper pillar) formed by a sputtering, printing, electro plating, electroless plating, CVD, or the like. The metal pillars may be solder free and have substantially vertical sidewalls. In some embodiments, a metal cap layer (not shown) is formed on the top of the metal pillar connectors 142. The metal cap layer may include nickel, tin, tin-lead, gold, silver, palladium, indium, nickel-palladiumgold, nickel-gold, the like, or a combination thereof and may be formed by a plating process.

As further illustrated by FIG. 1N, passive devices 144 may be bonded to the metallization pattern 138. Embodiment passive devices 144 may include resistors, capacitors, inductors, combinations thereof, or the like. The passive devices 144 may be flip chip bonded to UBMs 140' formed on the metallization pattern 138. In some embodiments, the UBMs 140' may have a smaller pitch than UBMs 140 on which the conductive connectors 142 are disposed. An underfill 146 may be flowed under the passive devices 144 and around the UBMs 140'.

In FIG. 1O, a carrier substrate de-bonding is performed to detach (de-bond) the carrier substrate 116 from dielectric layer 122. In accordance with some embodiments, the de-bonding includes projecting a light such as a laser light or an UV light on the LTHC film 118 so that the LTHC film 118 decomposes under the heat of the light and the carrier substrate 116 can be removed. After the carrier substrate 116 is removed, a cleaning process may be applied to remove the DAF 120.

After the carrier substrate 116 is removed, openings are formed through the dielectric layer 122 to expose portions of the through vias 112B. The openings may be formed, for example, using laser drilling, etching, or the like.

After the through vias 112B are exposed, another package component 152 may be bonded to the through vias 112B using, e.g., conductive connectors 148 extending through the dielectric layer 122. The other package component 152 may be a bare chip (e.g., a die similar to the dies 200), a packaged device comprising one or more chips (e.g., a memory package, such as a dynamic random access memory (DRAM) package, or the like), an interposer, a printed circuit board, or the like.

Either prior to or after the package component 152 is bonded to the through vias 112B, a singulation process is performed by sawing along scribe line regions e.g., between adjacent regions of a wafer on which the redistribution structure 150 is formed. The sawing singulates a first package region from a second package region to provide individual device packages 100.

The device package 100 includes dies 200 hybrid bonded to respective dies 300. The dies 200 and 300 are encapsulated in an encapsulant 114, and thermal vias 112A extend from surfaces of the dies 200 through the encapsulant 114. The thermal vias 112A provide thermal dissipation for the dies 200 through the encapsulant 114. In some embodiments, the thermal vias 112A are dummy features and are electrically isolated from other components in the package 100. In other embodiments, the thermal vias 112A also provide electrical connection between conductive features (e.g., metallization patterns 134, 136, and 138, UBMs 140, and connectors 142) in the redistribution structure 150 and the dies 200. The package 100 further includes conductive through vias 112B, which extend through the encapsulant 114 and provide electrical connection between the dies 200, the dies 300, conductive features (e.g., metallization patterns 134, 136, and 138, UBMs 140, and connectors 142) in the redistribution structure 150, and package components bonded to the through vias 112B (e.g., package component 152). In this manner, thermal dissipation, multi-chip stacking, flexible design rules for chip sizes, and enhanced signal transmission performance can be achieved in a device package using fan-out processes with chip to wafer and/or wafer to wafer bonding processes.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 2A through 2I illustrate intermediate steps of manufacturing a semiconductor device package 400 according to alternative embodiments. The device package 400 may be similar to the device package 100 where like reference numerals indicate like elements formed using like processes.

Figure 2A:
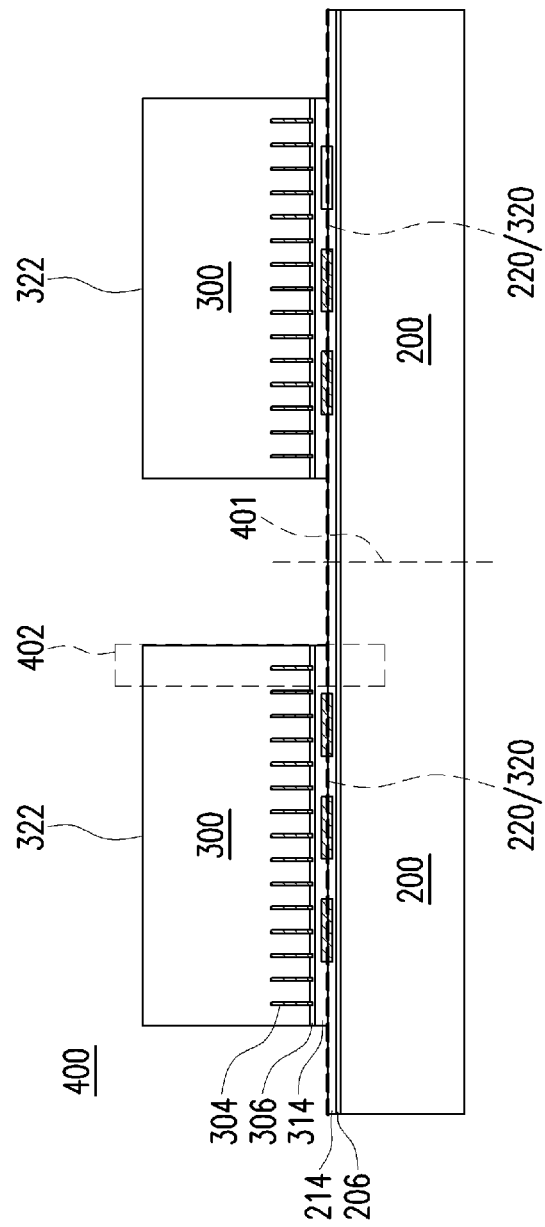
Figure 2B:
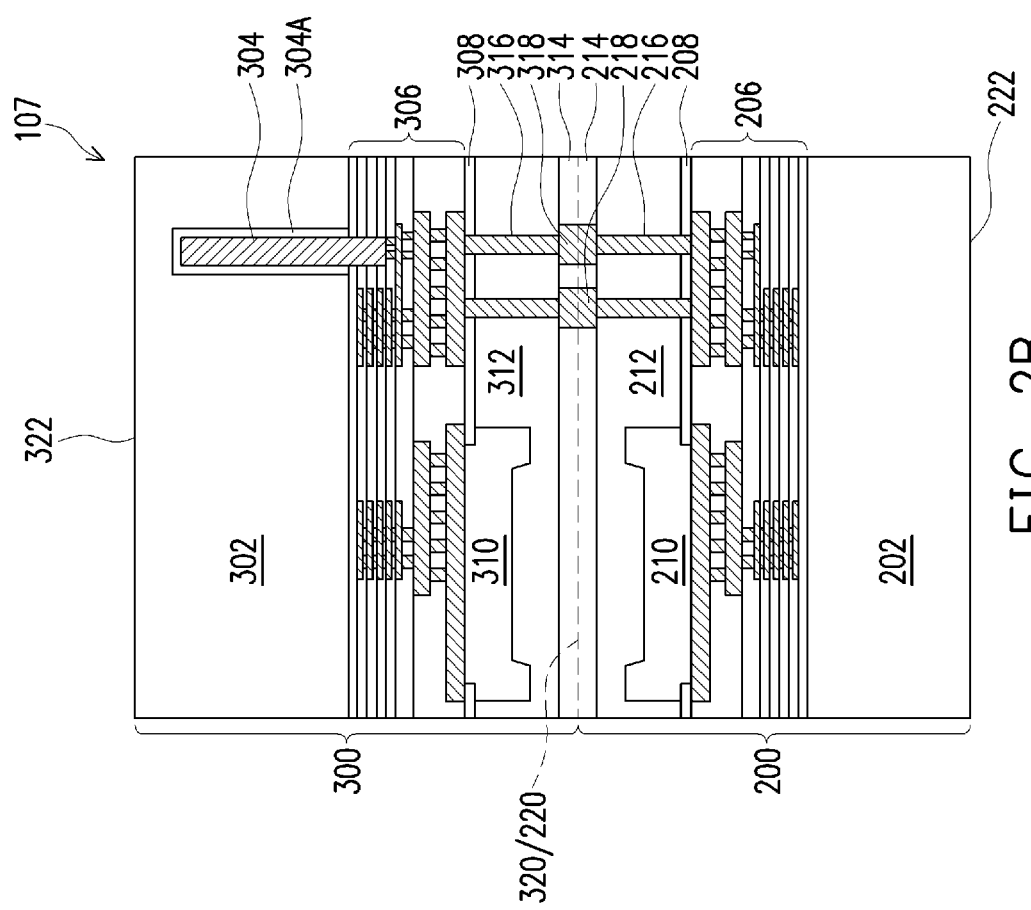
Figure 4D:
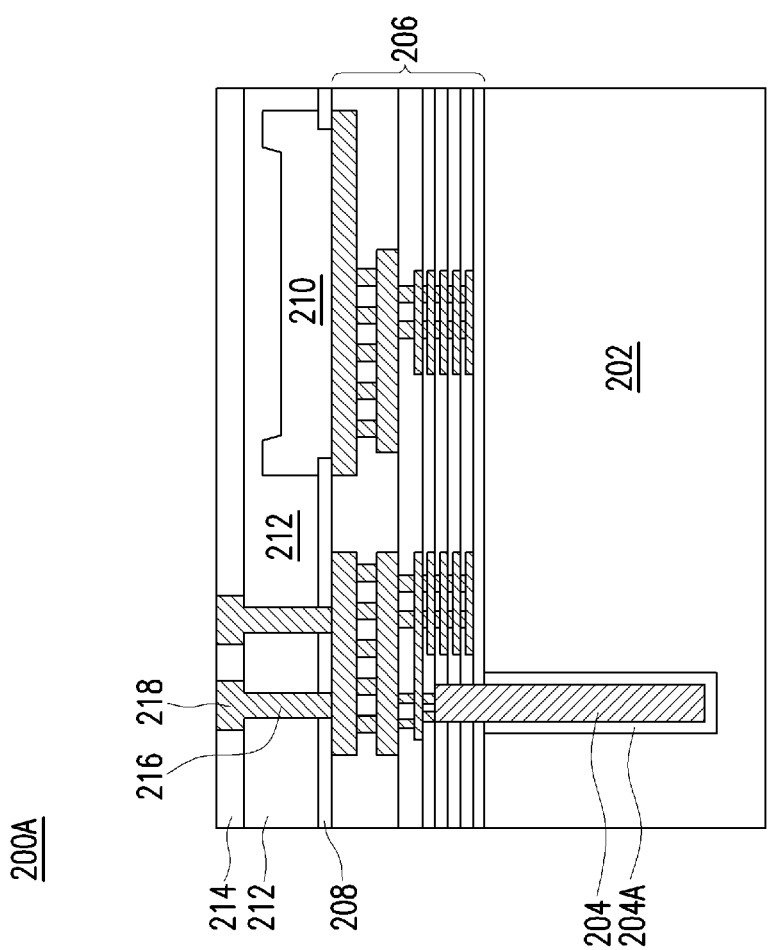
Figure 5A:
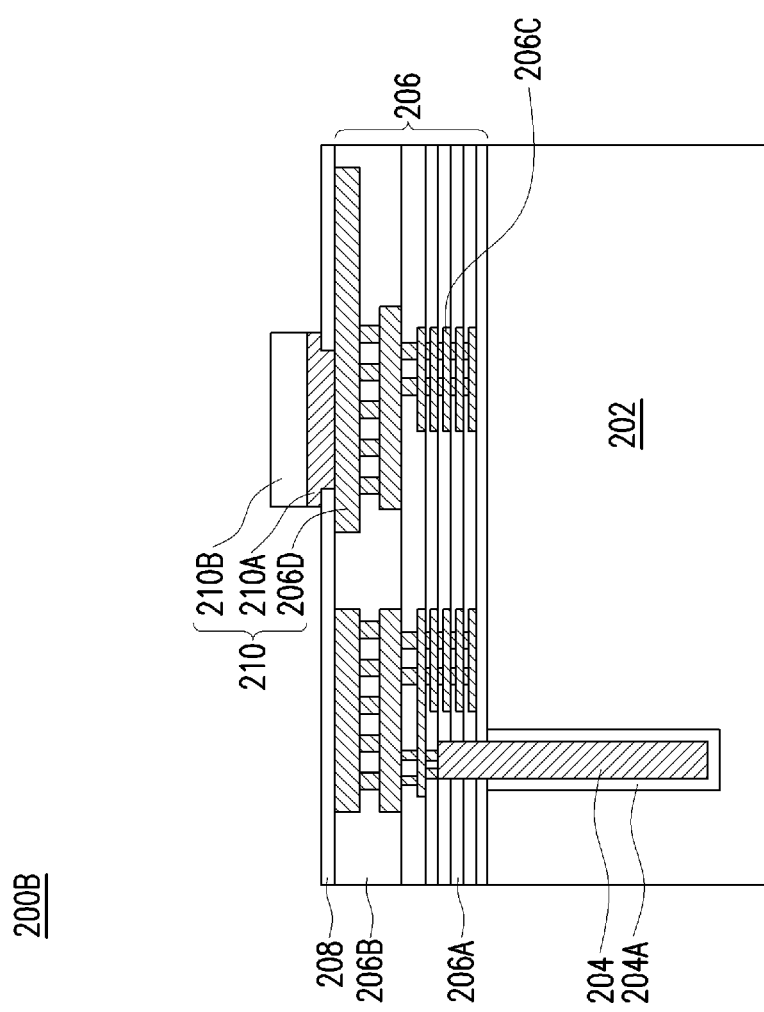
FIGS. 5A through 5D are cross-sectional views of intermediate steps of manufacturing a semiconductor device in accordance with some embodiments.
Figure 5B:
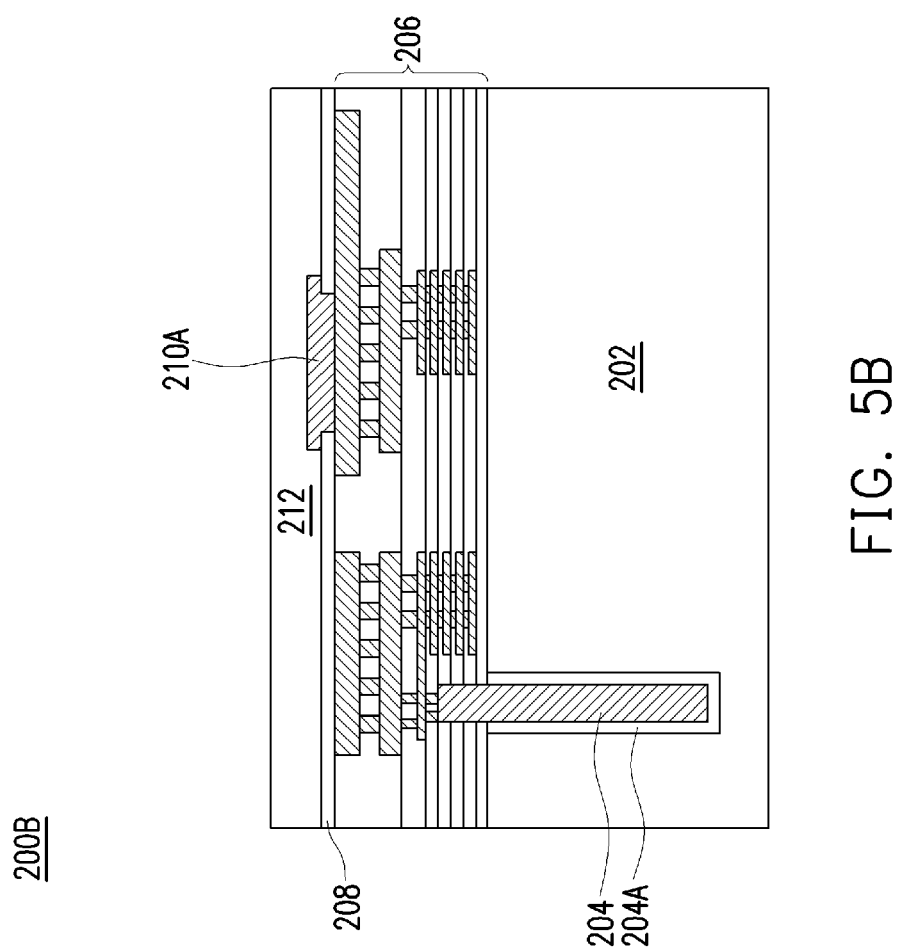
Figure 5C:
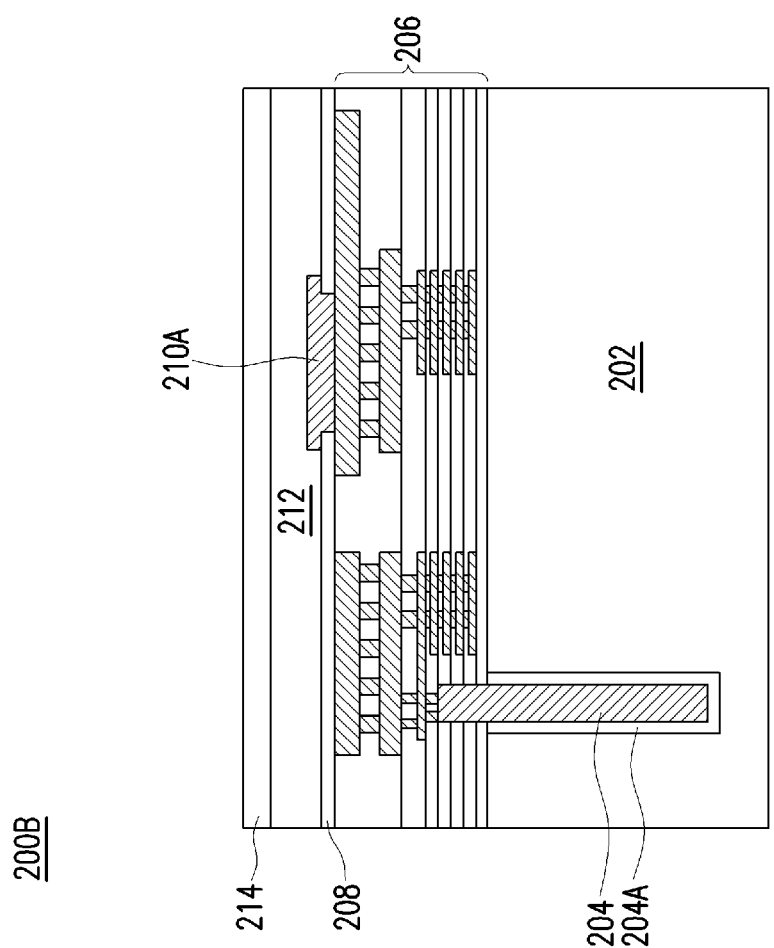
Figure 5D:
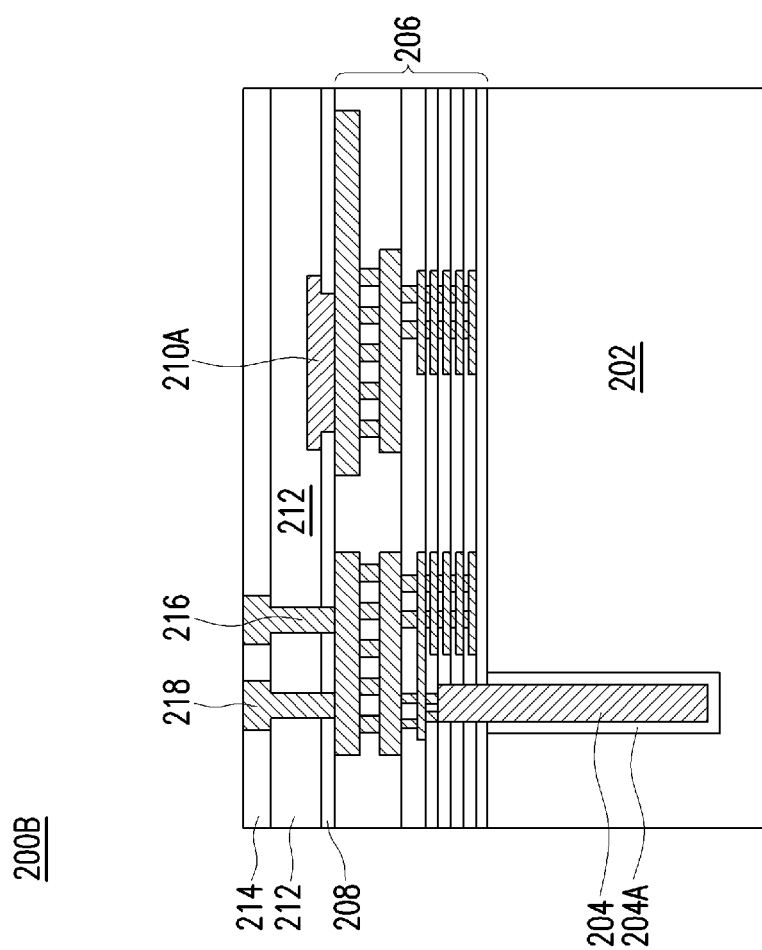
Figure 6B:
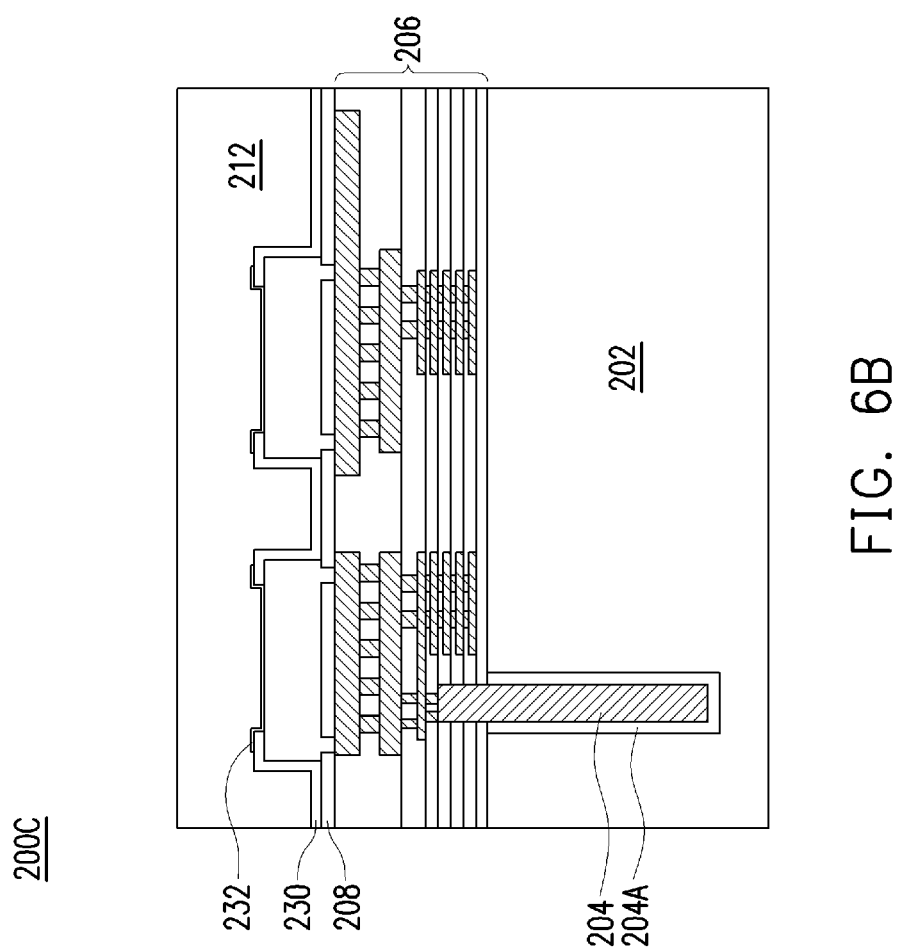
Figure 6D:
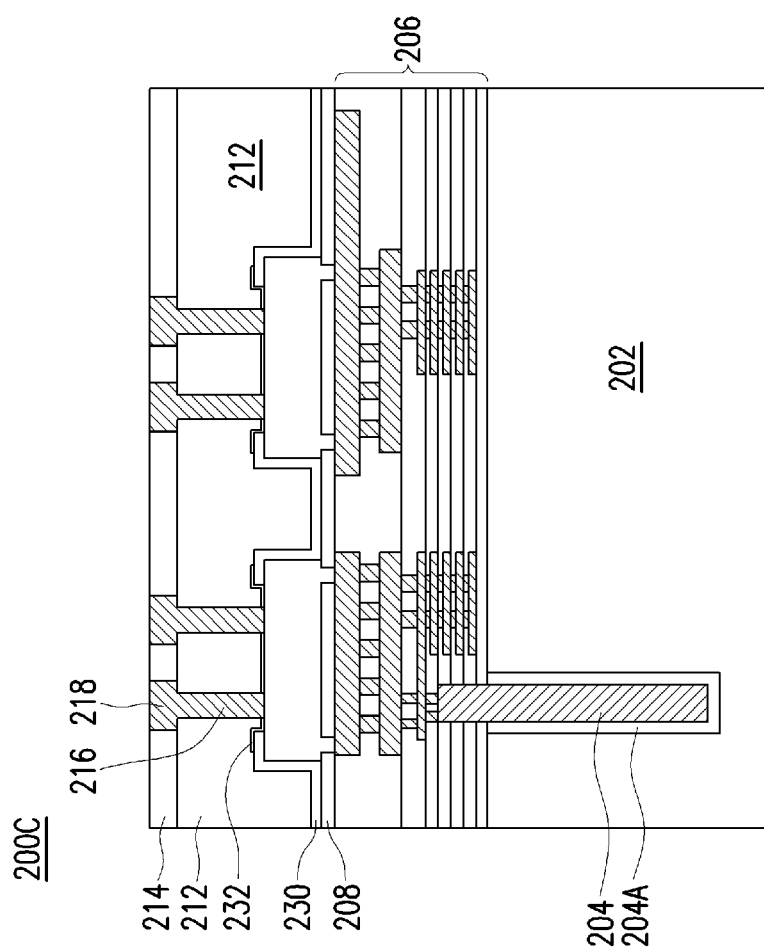
Figure 7B:
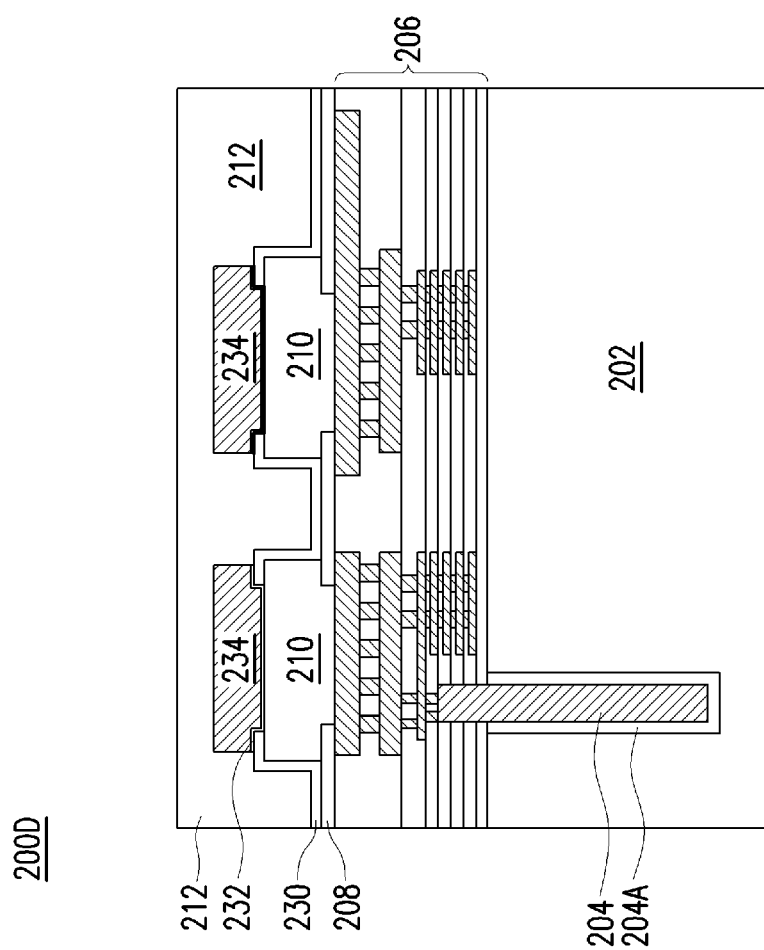
Figure 7C:
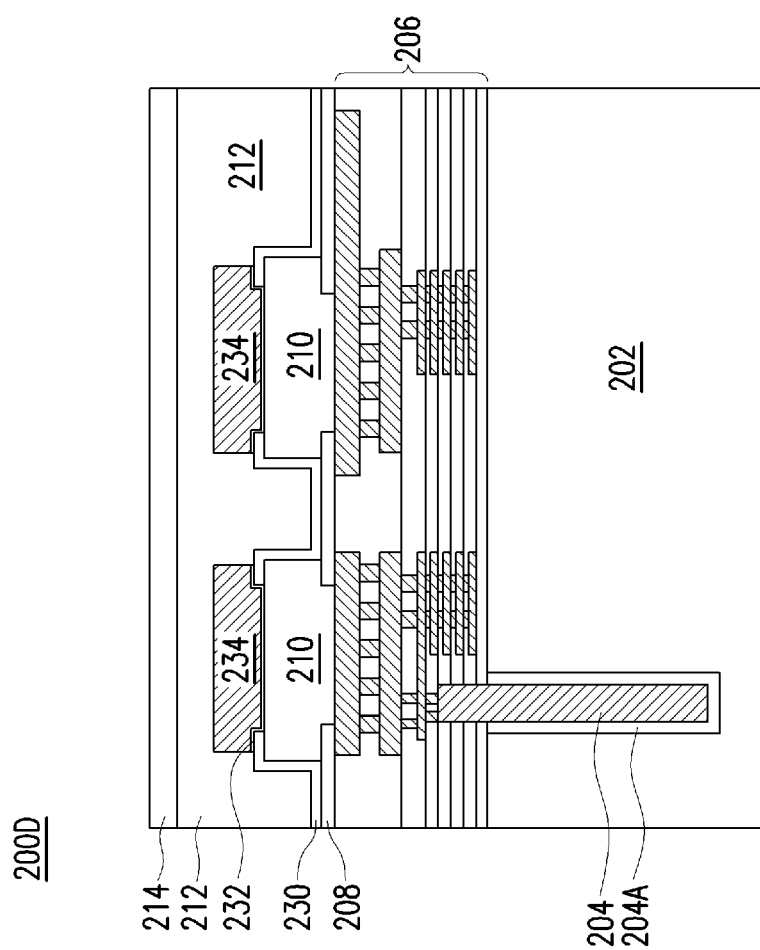
Figure 7D:
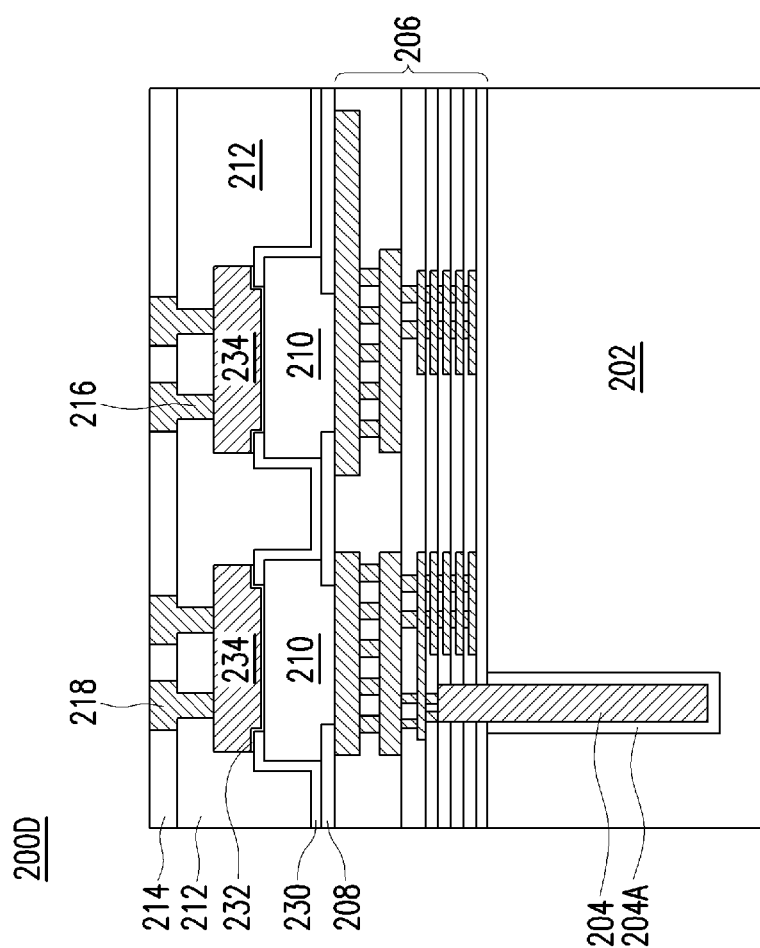

Referring to FIGS. 2A and 2B, the dies 300 are bonded the dies 200. FIG. 2B illustrates a detailed view of region 402 of the bonded dies 200/300. Although FIG. 2B illustrates the dies 300 and 200 having a configuration described below in FIG. 4D, the dies 200 and 300 may have a different configuration, for example, as illustrated in FIG. 5D, 6D, or 7D, described below. In package 400, the dies 300 are bonded to the dies 200 in a face-to-face configuration such that a front side 320 of the dies 300 face towards a front side 220 of the dies 200. The bonding layers 314 of the dies 200 are directly bonded to bonding layers 214 of the die 200 to form a dielectric-to-dielectric bond, and connectors in the bonding layer 314 (e.g., contact pads 318) are directly bonded to connectors in the bonding layer 214 (e.g., contact pads 218) to for conductor-to-conductor bonds. Further, the dies 300 may be bonded to the dies 200 while the dies 200 are still part of a larger wafer and prior to the dies 200 being singulated from the wafer, for example, along scribe lines 401. Scribe lines 401 provide a boundary between adjacent dies 200. In the illustrated embodiment, the dies 300 include through vias 304, and the dies 200 do not include any through vias. In other embodiments, the dies 200 include through vias (e.g., through vias 204, see FIGS. 4D, 5D, 6D, and 7D).

Figure 2C:
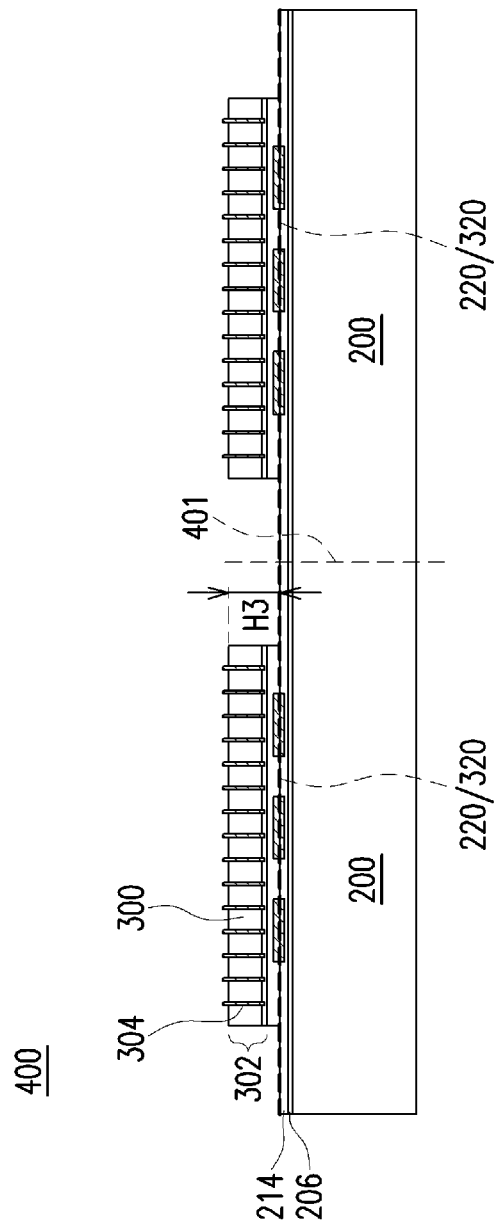

In FIG. 2C, a thinning process may be applied to the dies 300 to expose the through vias 304. The thinning removes portions of the substrates 302 over the through vias 304. In some embodiments, the thinning may further remove lateral portions of a barrier layer 304A (see FIG. 2B) on the through vias 304 to expose the through vias 304. The thinning process may further recess the substrate 302 below a topmost surface of the through vias 304 such that the through vias 304 extend above the substrate 302. The thinning process may comprise performing a CMP, grinding, an etch back (e.g., a wet etch), combinations thereof, or the like. Prior to thinning, a height of the dies 300 may be about 100 μm or more, and after thinning, a height H3 of the dies 300 may 50 μm or less. By thinning the dies 300 to this height, improvements in device density and electrical performance can be observed in the completed package 400. Further, a height of the dies 200 may be about 100 μm.

Figure 2D:
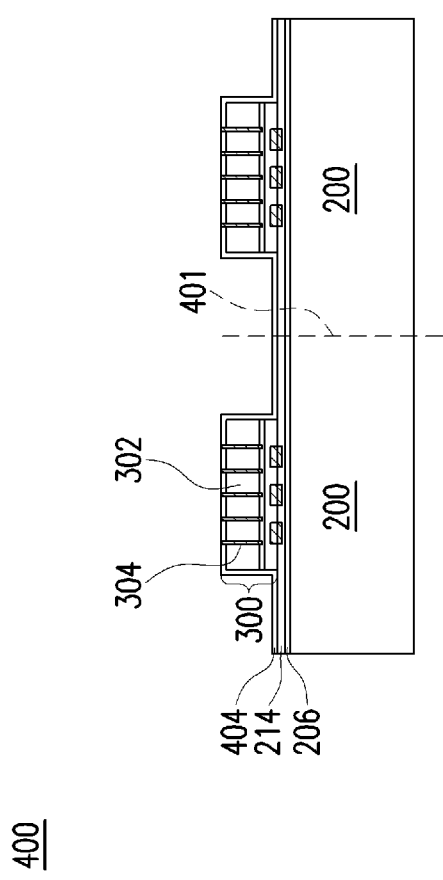

In FIG. 2D, a passivating dielectric layer 404 is deposited over the bonding layer 214 of the die 200 as well as over and along sidewalls of the dies 300. In some embodiments, the dielectric layer 404 is a low-temperature polyimide (LTPI) having a curing temperature of about 220° C. or less. By using a LTPI, the dielectric layer 404 may be deposited without damaging features of the dies 200/300. In some embodiments, the dielectric layer 404 comprises a different material. The dielectric layer 404 may be formed by spin coating, lamination, CVD, the like, or a combination thereof. The dielectric layer 404 may further be formed around exposed areas of the through vias 304, such as areas of the through vias 304 which extend above the substrate 302.

Figure 2E:
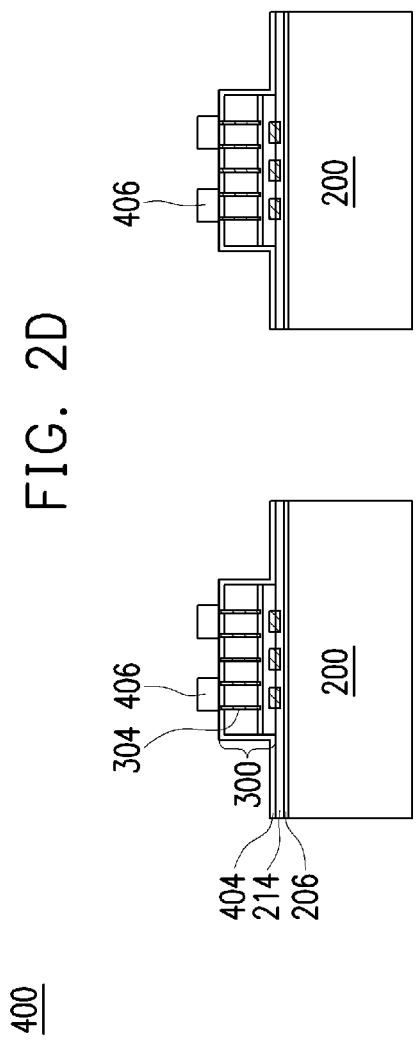

In FIG. 2E, a singulation process is applied along scribe lines 401 to separate adjacent dies 200. The singulation process may include mechanical sawing, laser dicing, plasma dicing, combinations thereof, or the like.

As further illustrated in FIG. 2E, contact pads 406 may be formed over the through vias 304 and the dielectric layer 404. The contact pads may be electrically connected to the through vias 304, and the contact pads 406 may provide a larger contact area for making electrical connection to the dies 300 in subsequent process steps (e.g., when the redistribution structure 150 is formed in FIG. 2H). The contact pads 406 may be formed of a similar material and a similar process as the metallization pattern 134 described above. After the contact pads 406 are formed, a combined height of the dies 200, dies 300, and contact pads 406 may be about 180 µm or less.

Figure 2F:
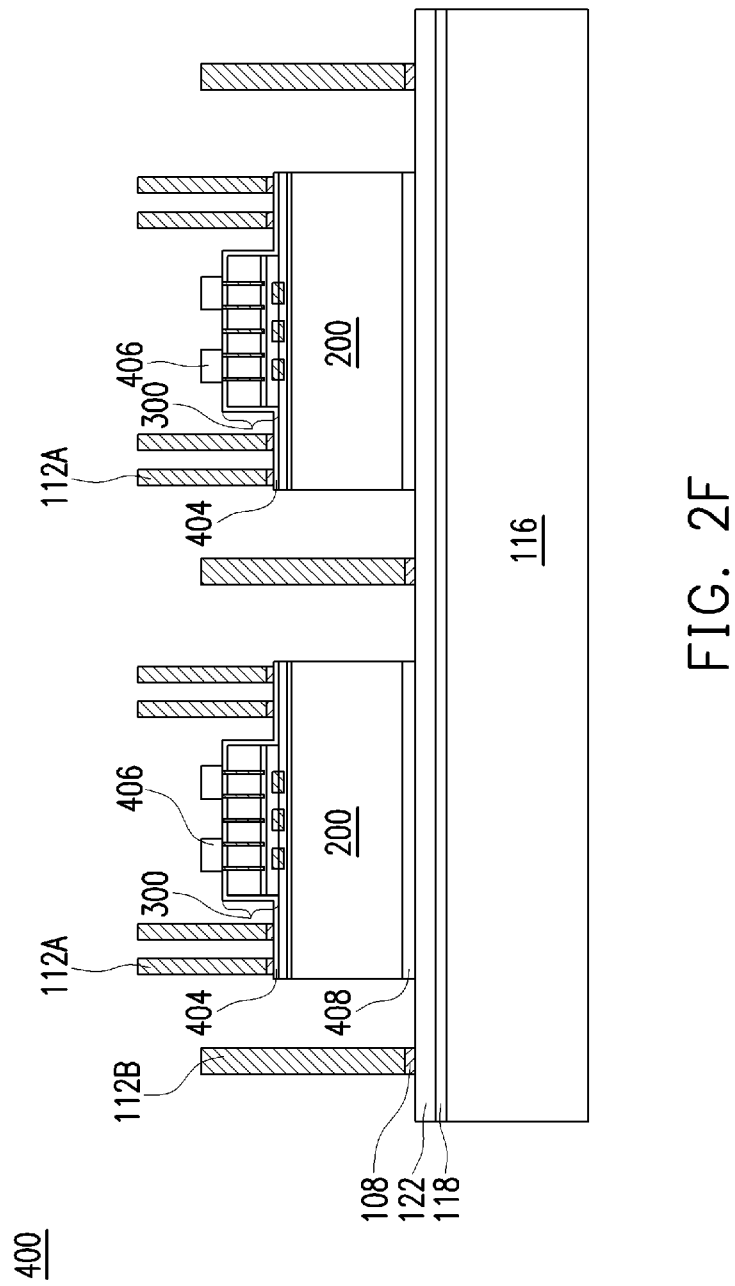

In FIG. 2F, the singulated dies 200/300 are attached to a dielectric layer 122 on a carrier substrate 116 using a DAF 408. The DAF 408 may be similar to the DAF 116 described above. The dielectric layer 122 may be attached to a carrier substrate 116 by a LTHC film 118. After the singulated dies 200/300 are attached to the carrier 116, thermal vias 112A and through vias 112B are formed around the dies 200/300. Specifically, the thermal vias 112A may be formed on the dies 200 adjacent the dies 300, and the though vias 112B may be formed on the carrier 116 adjacent the dies 200. The thermal vias 112B may be formed on the dielectric layer 404 such that the dielectric layer 404 is disposed between a bottom surface of the thermal vias 112A and a top surface of the dies 200. The thermal vias 112A and through vias 112B may have a similar configuration and be formed using a similar process as the thermal vias 112A and through vias 112B described above with respect to FIGS. 1G through 1J.

Figure 2G:
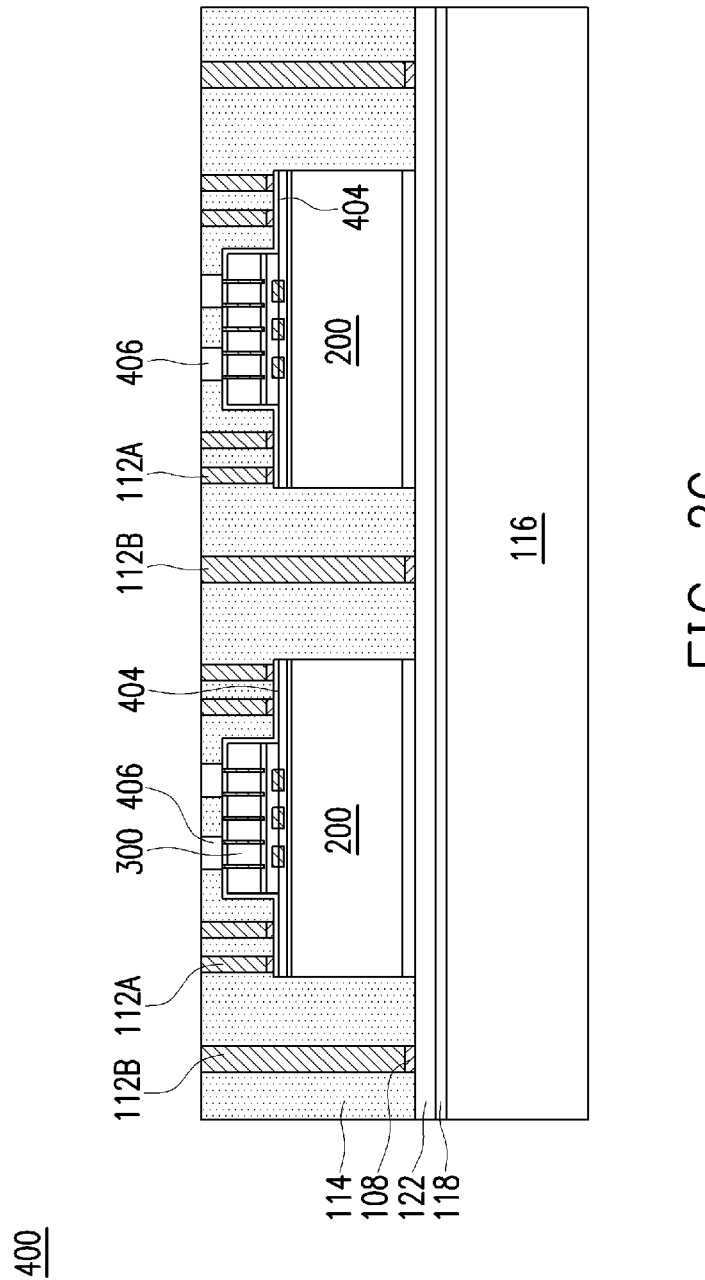

In FIG. 2G, an encapsulant 114 is formed around the dies 200, the dies 300, the thermal vias 112A, and the through vias 112A. A planarization may be performed to level top surfaces of the encapsulant 114, the contact pads 406, the thermal vias 112A, and the through vias 112B.

Figure 2H:
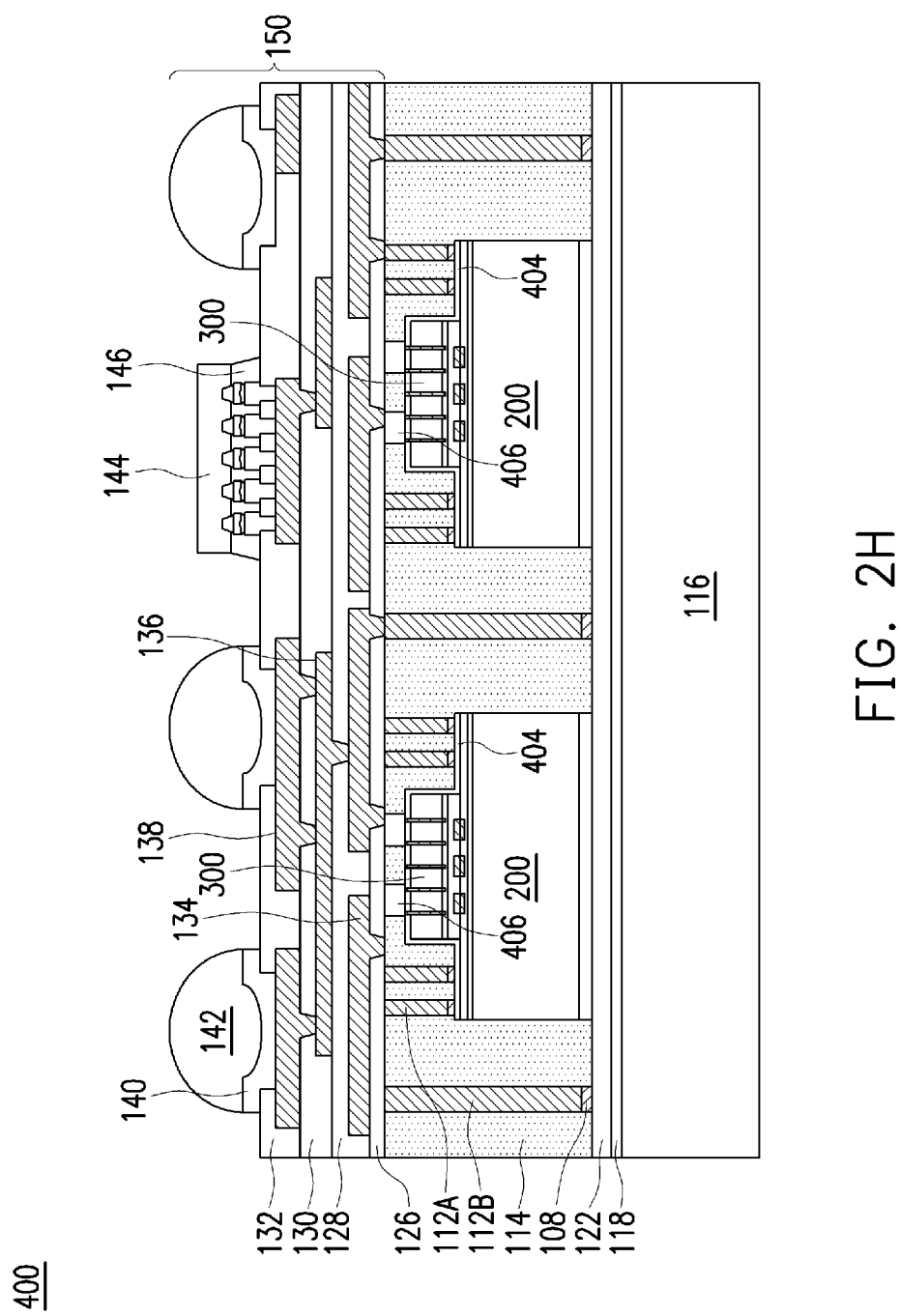
Figure 21:
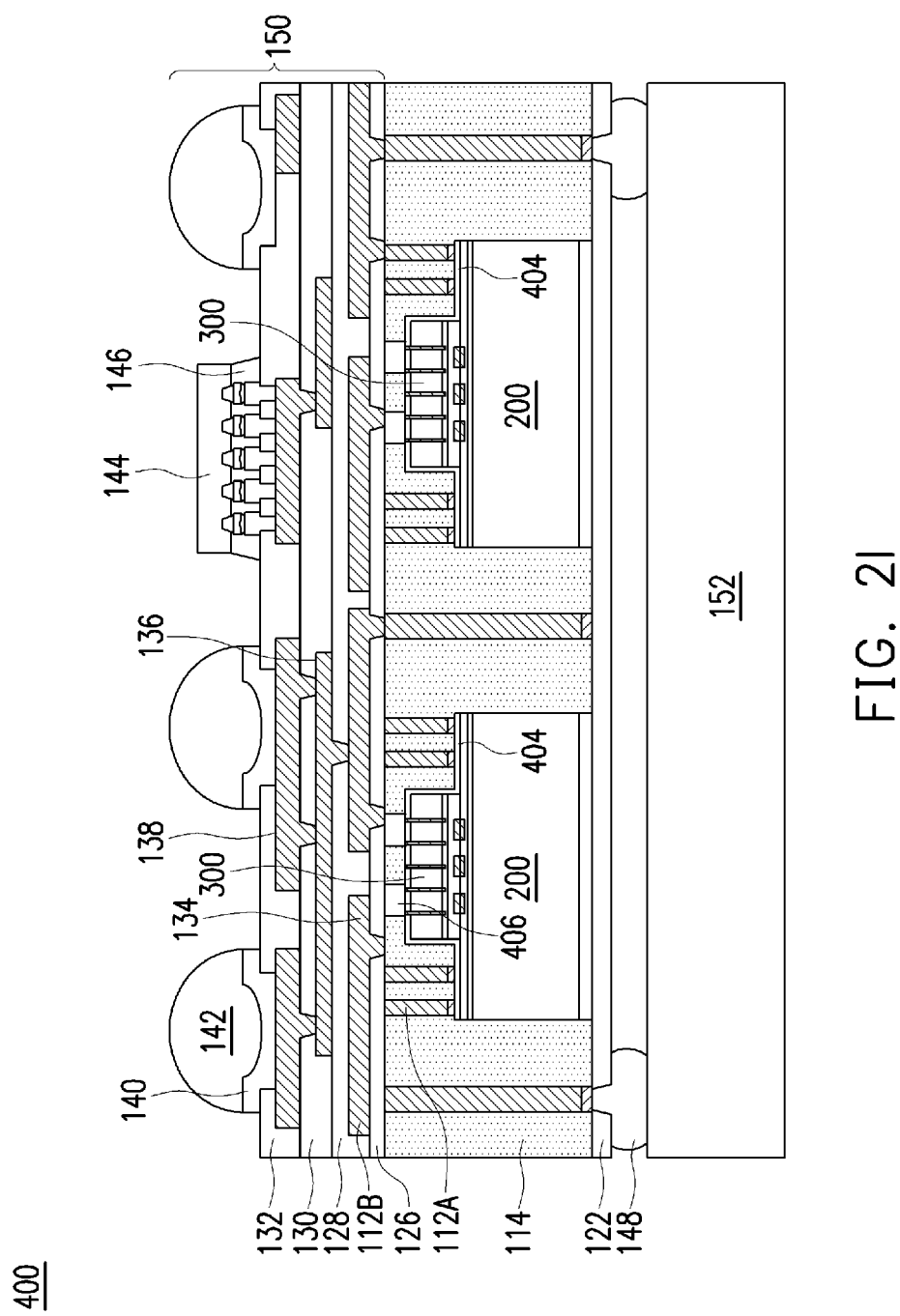

In FIG. 2H, a redistribution structure 150 is formed over the dies 200, the dies 300, and the encapsulant 114. The redistribution structure includes dielectric layers 126, 128, 130, and 132; metallization patterns 134, 136, and 138; UBMs 140; and conductive connectors 142. The metallization patterns 134, 136, and 138 may be electrically connected to the through vias 112B and the contact pads 406, which provides electrical connection to the dies 200/300. The metallization patterns 134, 136, and 138 may or may not be electrically connected to the thermal vias 112A.

In FIG. 2I, the carrier substrate 116 is removed, for example, by applying light to the LTHC film 118. The polymer layer 122 is then patterned, and another package component 152 may be bonded to the through vias 112B using, e.g., conductive connectors 148 extending through the dielectric layer 122. The other package component 152 may be a bare chip (e.g., a die similar to the dies 200), a packaged device comprising one or more chips (e.g., a memory package, such as a DRAM package, or the like), an interposer, a printed circuit board, or the like. Thus, a device package 400 having face-to-face hybrid bonded dies 200 and 300 is formed according to some embodiments.

FIGS. 3A through 3H illustrate intermediate steps of manufacturing a semiconductor device package 500 according to alternative embodiments. The device package 500 may be similar to the device package 400 where like reference numerals indicate like elements formed using like processes.

Figure 3A:
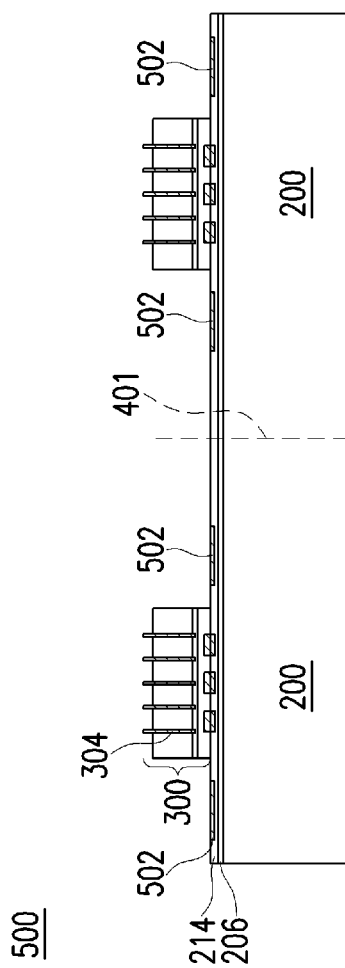

Referring to FIG. 3A, the dies 300 are bonded to the dies 200. In package 500, the dies 300 may be face-to-face bonded and hybrid bonded to the dies 200 in similar manner as the dies 200 and 300 are bonded in the package 400 (e.g., as illustrated in FIGS. 2A and 2B). After the dies 300 may be bonded to the dies 200 while the dies 200 are still physically connected in a wafer. After the dies 200 and 300 are bonded, a thinning process may be applied to the substrate 302 of the die 300 to expose the through vias 304. After thinning, a height of the dies 300 may be about 20 µm or less in the package 500. Other dimensions for the dies 300 are also possible. The process steps for arriving at the structure illustrated in FIG. 3A is described above with respect to FIGS. 2A through 2C and is not repeated herein for brevity. In package 500, the dies 200 includes contact pads 502 exposed at a top surface of the bonding layer 214. The contact pads 502 may be electrically connected to or electrically isolated from active devices and integrated circuits o the dies 200. The contact pads 502 are disposed in an area of dies 200 not covered by the dies 300.

Figure 3B:
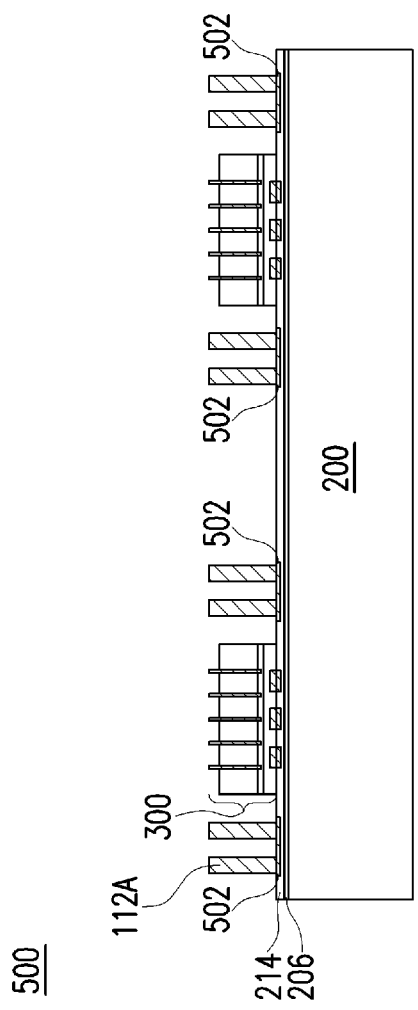

In FIG. 3B, thermal vias 112A are formed on the contact pads 502. To form the thermal vias 112A, a photo resist is formed and patterned on the contact pads 502. The photo resist may be formed by spin coating or the like and may be exposed to light for patterning. The pattern of the photo resist corresponds to the thermal vias 112A. The patterning forms openings through the photo resist to expose the seed layer. A conductive material is then formed in the openings of the photo resist and on the exposed portions of contact pads 502. The contact pads function as a seed layer during the plating process, removing the need for a separate seed layer and reducing manufacturing cost. The conductive material may be formed by plating, such as electroplating or electroless plating, or the like. The conductive material may comprise a metal, like copper, titanium, tungsten, aluminum, or the like. The photo resist may be removed by an acceptable ashing or stripping process, such as using an oxygen plasma or the like. A height of the thermal vias 112A may be about 30 µm or less, and the thermal vias 112A may extend above the dies 300. Other dimensions for the thermal vias 112A are also possible.

Figure 3C:
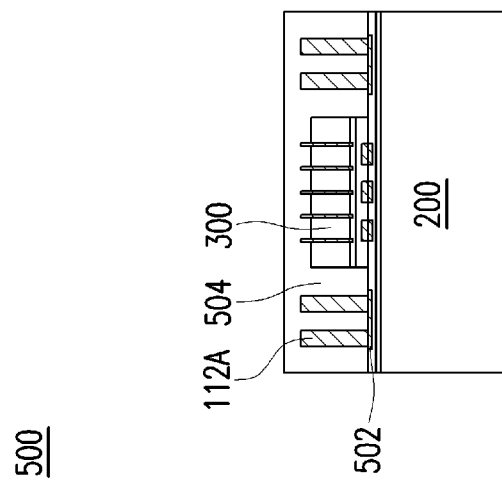

In FIG. 3C, a passivating dielectric layer 504 is deposited around the dies 300 and the thermal vias 112A. The dielectric layer 504 may be comprised of a similar material and be formed using a similar process as the dielectric layer 404. The dielectric layer 504 may cover top surfaces of the through vias 112A, the dies 200, and the through vias 314.

In FIG. 3D, through vias 112B are formed on a polymer layer 122, which is formed on a carrier substrate 116. The through vias 112B are formed prior to attaching the dies 200 and 300 to the carrier substrate 116. A LTHC film 118 may be disposed between the carrier substrate 116 and the polymer layer 122. The through vias 112B may have a similar configuration and be formed using a similar process as the through vias 112B described above with respect to FIGS. 1G through 1J. A height of the through vias 112B on the carrier 116 may be in the range of about 180 µm to about 200 µm. Other dimensions for the through vias 112B are also possible.

Figure 3E:
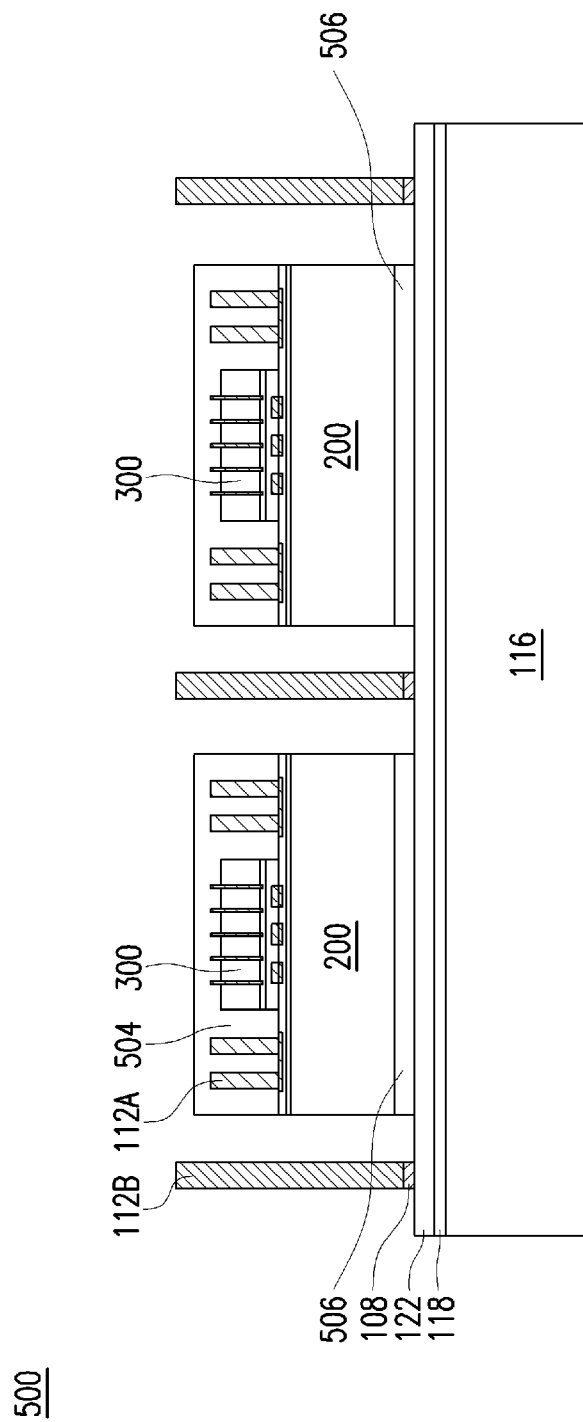

In FIG. 3E, the bonded dies 200 and 300 are attached to the carrier substrate 116 by a DAF 406.

Figure 3F:
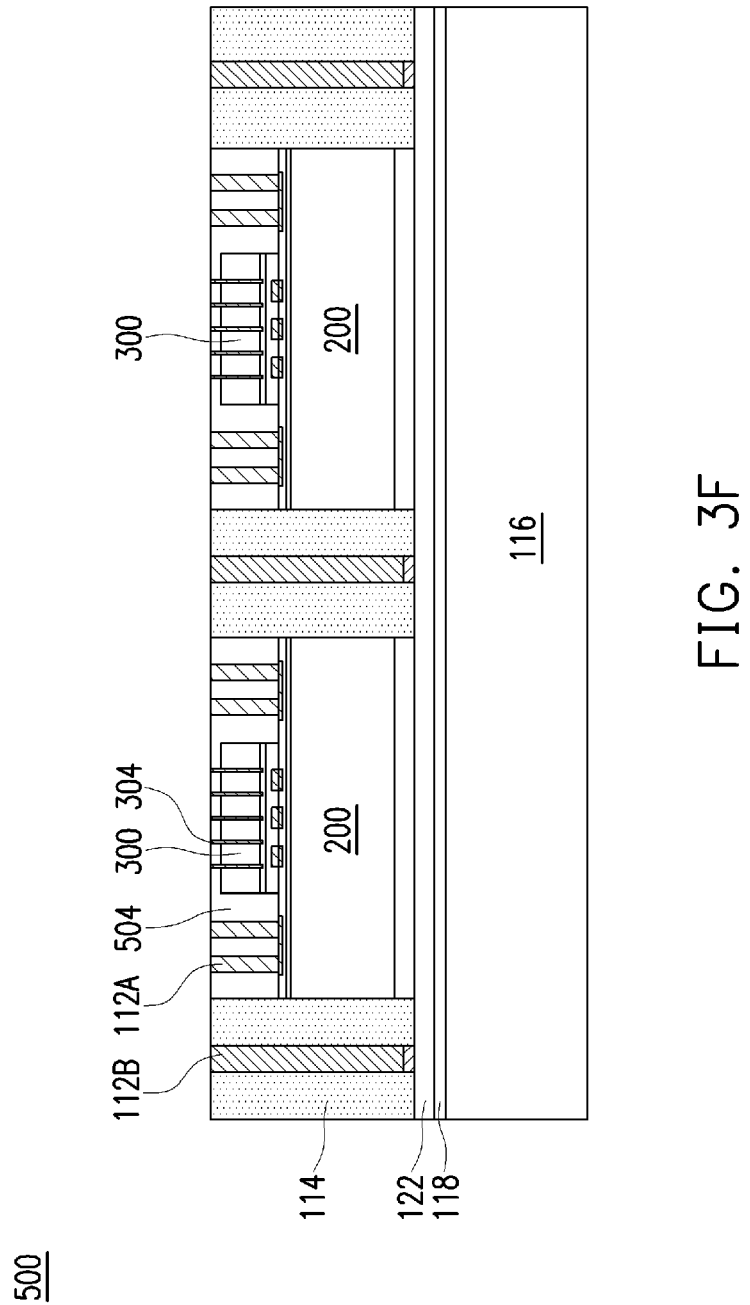

In FIG. 3F, an encapsulant 114 is formed around the dies 200, the dies 300, the thermal vias 112A, and the through vias 112A. A planarization may be performed to level top surfaces of the encapsulant 114, the through vias 304 of the dies 300, the dielectric layer 506, the thermal vias 112A, and the through vias 112B.

Figure 3G:
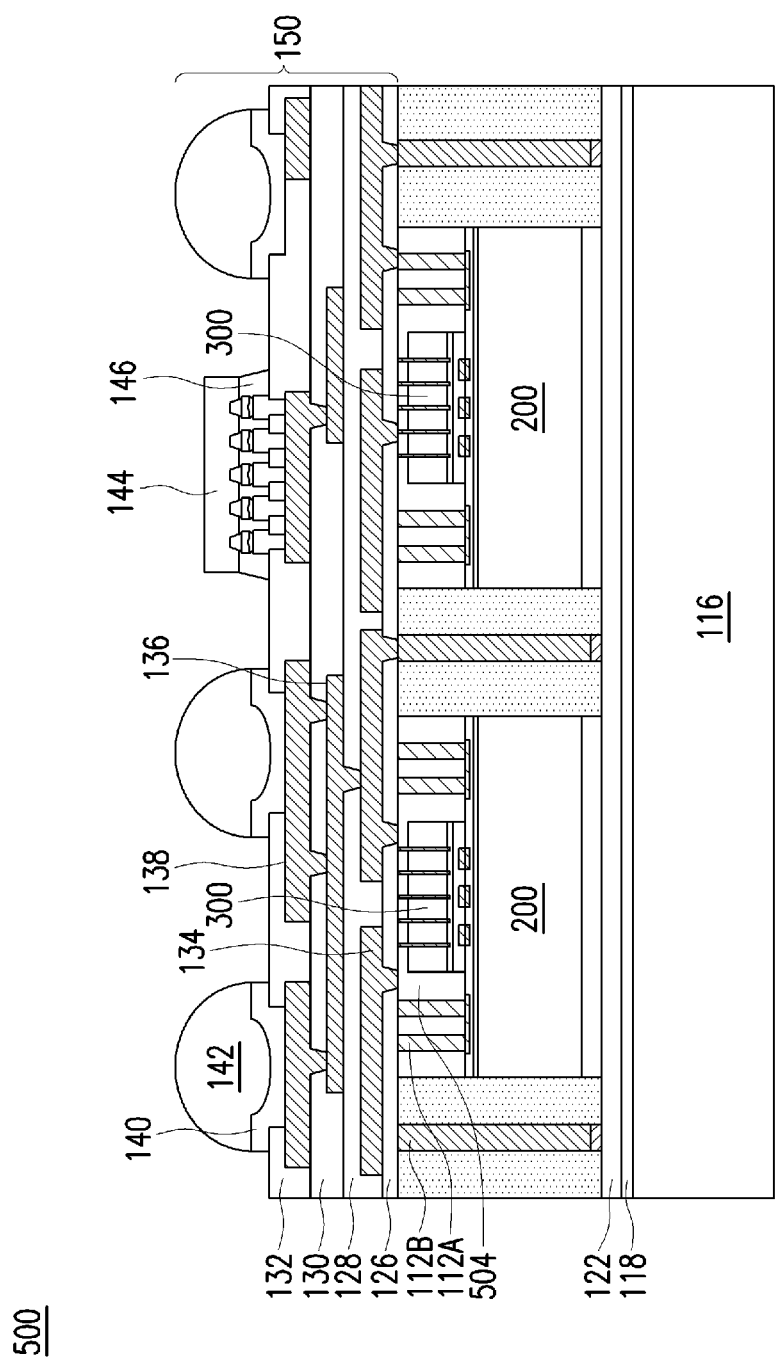

In FIG. 3G, a redistribution structure 150 is formed over the dies 200, the dies 300, and the encapsulant 114. The redistribution structure includes dielectric layers 126, 128, 130, and 132; metallization patterns 134, 136, and 138; UBMs 140; and conductive connectors 142. The metallization patterns 134, 136, and 138 may be electrically connected to the through vias 112B and through vias 304, which provides electrical connection to active devices of the dies 200 and 300. The metallization patterns 134, 136, and 138 may or may not be electrically connected to the thermal vias 112A.

Figure 3H:
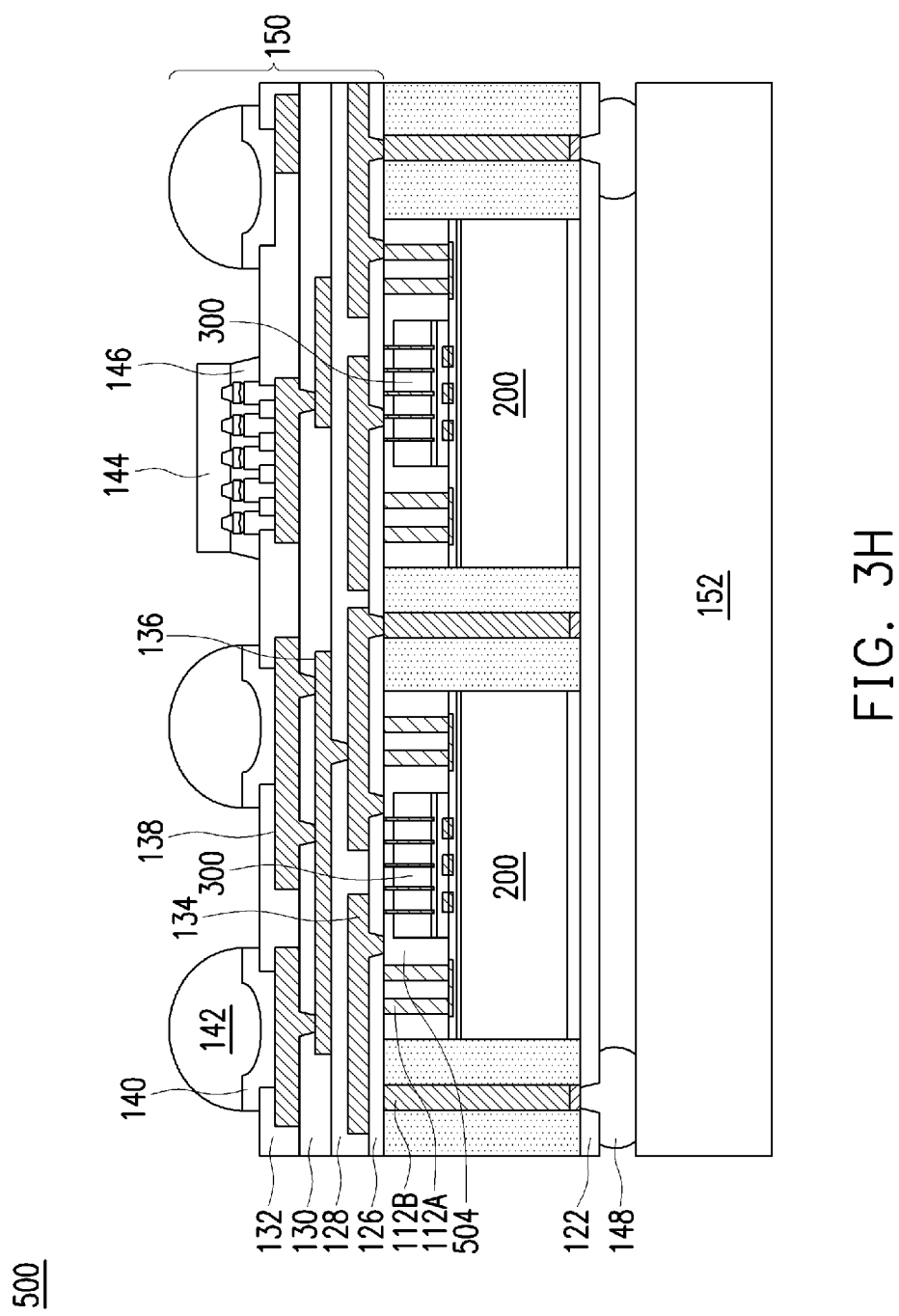

In FIG. 3H, the carrier substrate 116 is removed, for example, by applying light to the LTHC film 118. The polymer layer 122 is then patterned, and another package component 152 may be bonded to the through vias 112B using, e.g., conductive connectors 148 extending through the dielectric layer 122. The other package component 152 may be a bare chip (e.g., a die similar to the dies 200), a packaged device comprising one or more chips (e.g., a memory package, such as a DRAM package, or the like), an interposer, a printed circuit board, or the like. Thus, a device package 500 having face-to-face hybrid bonded dies 200 and 300 is formed according to some embodiments.

Figure 4B:
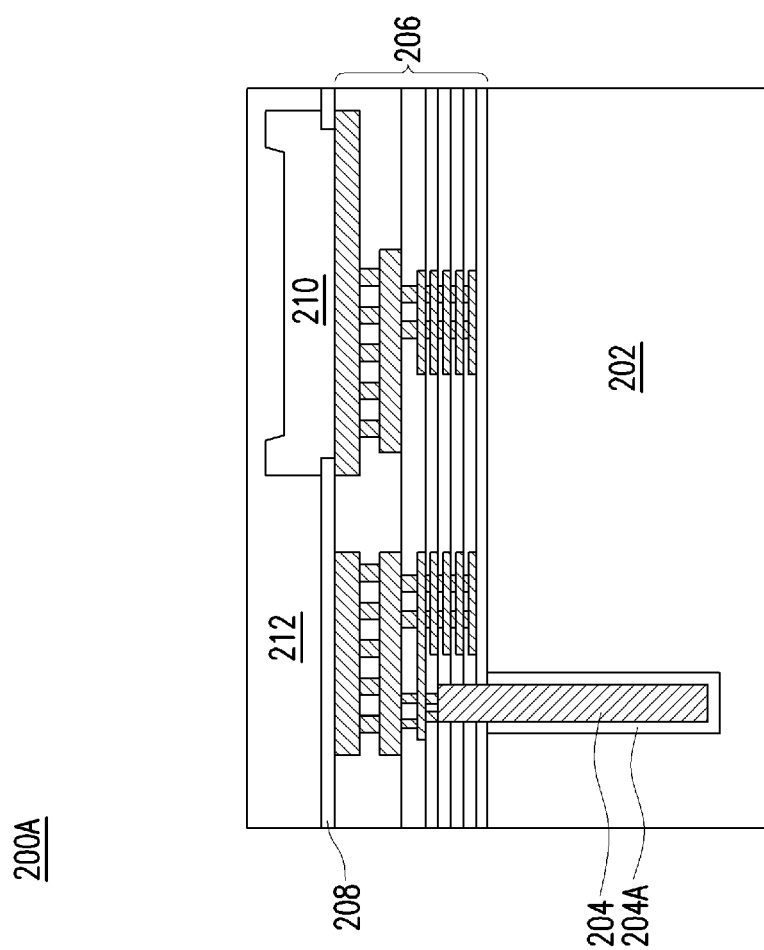
Figure 4C:
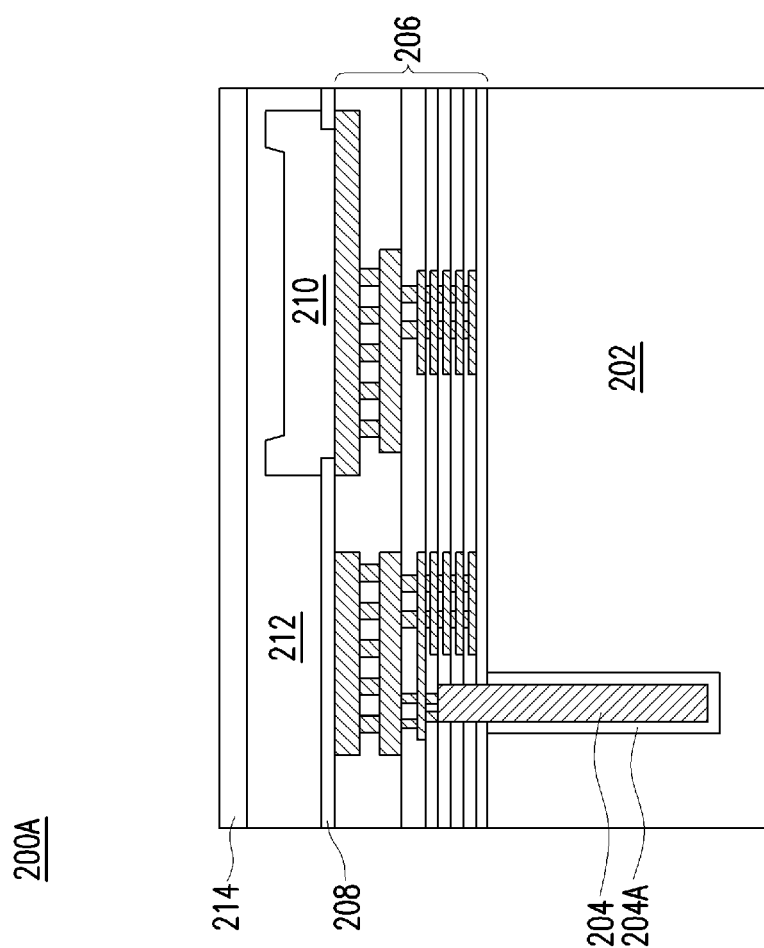

FIGS. 4A through 4C illustrate cross-sectional views of intermediary steps of forming a bonding layer over a die according to some embodiments. FIG. 4D illustrates the optional formation of conductive features in the bonding layer to provide electrical connection to the integrated circuits within the die according to some embodiments. In FIG. 4A, a die 200A is illustrated. Details of the die 200A are described above in conjunction with FIGS. 1A and 1s not repeated again for brevity.

After the passivation layer 208 and the contact pad 210 are formed, a CP test may be applied to the die 200 using the pads 210. The CP test checks electrical functionality of the die 200 and identifies KGDs. When a die 200 is identified as a KGD, a dielectric layer 212 is deposited over the passivation layer 208 and the contact pads 210 as illustrated by FIG. 4B. The dielectric layer 212 may comprise any suitable insulating material (e.g., TEOS, or the like), and the dielectric layer may cover a top surface of the contact pad 210. Depositing the dielectric layer 212 may be performed using any suitable process, such as, PVD, CVD, ALD, or the like. After the dielectric layer 212 is deposited, a planarization process (e.g., a CMP) may be applied to a top surface of the dielectric layer 212. Thus, the dielectric layer 212 acts as a planarization layer, which provides a planar top surface for forming a bonding layer.

In FIG. 4C, a bonding layer 214 is deposited on the planar top surface of the dielectric layer 212. The bonding layer 214 may comprise any suitable material for forming a dielectric-to-dielectric bond. For example, the bonding layer 214 may comprise silicon oxide, silicon nitride, silicon oxynitride or the like. Depositing the bonding layer 214 may be performed using any suitable process, such as, PVD, CVD, ALD, or the like.

FIG. 4D illustrates the optional formation of conductive vias 216 and contact pads 218 in the die 200. The conductive vias 216 extend through the dielectric layer 212 and the passivation film 208 and electrically connects the contact pads 218 to metallization patterns of the interconnect structure 206. The contact pads 218 are disposed in the bonding layer 214 and are exposed at a top surface of the bonding layer 214. For example, top surfaces of the bonding layer 214 and the contact pads 218 may be substantially planar. Forming the conductive vias 216 and the contact pads 218 may be achieved using any suitable process, such as a single damascene process, a dual damascene process, a plating process, combinations thereof, or the like.

In FIGS. 4A through 4D, the conductive pad 210 of the die 200A is a metal pad having a same material composition throughout. Other configurations for the conductive pad 210 are also possible. For example, each of the conductive pad 210 may comprise a conductive pillar 210A and a solder cap 210B disposed on the conductive pillar 210A as illustrated by the die 200B of FIGS. 5A through 5D. The die 200B in FIGS. 5A through 5D is similar to the die 200A in FIGS. 4A through 4D where like reference numerals indicate like elements formed using like processes. The solder cap 210B may be included in embodiments where solder caps 210B are beneficial for CP testing of the die 200. After the CP testing, the solder caps 210B may be removed using an etch back process, or the like. Subsequent processing may be similar to those discussed above with respect to FIGS. 4B through 4C. For example, in FIG. 4B, a dielectric layer 212 is deposited around the conductive pillars 210A after the solder caps 210B are removed. The dielectric layer 212 is planarized, and a bonding layer 214 is deposited over the dielectric layer 212. Optionally in FIG. 4D, conductive features (e.g., conductive vias 216 and contact pads 218) are formed in the bonding layer 214 and the dielectric layer 212 to provide electrical contacts to conductive features in the interconnect structure 206.

In FIGS. 4A through 4D, the CP tests are applied directly to the contact pads 210. In other embodiments, a conductive connector may be formed over the contact pads 210 for the CP tests as illustrated by the dies 200C and 200D or FIGS. 6A through 6D and FIGS. 7A through 7D, respectively. The dies 200C and 200D each include a passivation layer 230 formed over the passivation layer 208 and the contact pads 210. The passivation layer 230 may be formed in a manner similar to the passivation layer 230 and may be formed of the same insulating material or a different insulating material as the passivation layer 208. Openings are patterned through the passivation layer 230 to expose the contact pads 210.

After the contact pads 210 are exposed, conductive connectors 238 are formed through the passivation layer 230 and electrically connected to the contact pads 210. The conductive connectors 238 each comprise a seed layer 232, a conductive pillar 234, and a solder cap 236. To form the conductive connectors 238, the seed layer 232 is formed over the passivation layer 230 and in the openings extending through the dielectric layer passivation layer 230 on the contact pads 210. In some embodiments, the seed layer 232 is a metal layer, which may be a single layer or a composite layer comprising a plurality of sub-layers formed of different materials. In some embodiments, the seed layer 232 comprises a titanium layer and a copper layer over the titanium layer. The seed layer may be formed using, for example, PVD, or the like. A photo resist is then formed and patterned on the seed layer 232. The photo resist may be formed by spin coating or the like and may be exposed to light for patterning. The pattern of the photo resist corresponds to conductive pillars 234. The patterning forms openings through the photo resist to expose the seed layer 232. Conductive pillars 234 are then formed in the openings of the photo resist and on the exposed portions of the seed layer. The conductive pillars 234 may be formed by plating, such as electroplating or electroless plating, or the like. The conductive pillars 234 may comprise a metal, like copper, titanium, tungsten, aluminum, or the like. Next, the solder caps 236 are formed on the conductive pillars 234 by plating, or the like. The photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching.

CP testing may then be applied to the dies 200C or 200D using the conductive connectors 238. After the CP testing, the solder caps 236 may be removed using an etch back process, or the like. The conductive pillars 234 may also be removed as illustrated by FIG. 6B. Alternatively, the conductive pillars 234 may not be removed and remain after the CP testing as illustrated by FIG. 7B. In some embodiments, the seed layer 232 is not removed. In other embodiments, the seed layer 232 may also be removed. Subsequent processing may be similar to those discussed above with respect to FIGS. 4B through 4C. For example, in FIGS. 6B/7B, a dielectric layer 212 is deposited over the passivation layer 230 after portions of the conductive connectors 238 are removed. The dielectric layer 212 is planarized, and a bonding layer 214 is deposited over the dielectric layer 212. Optionally in FIGS. 6D/7D, conductive features (e.g., conductive vias 216 and contact pads 218) are formed in the bonding layer 214 and the dielectric layer 212 to provide electrical contacts to conductive features in the interconnect structure 206.

In accordance with some embodiments, stacked dies (e.g., a first die bonded to a second die) are encapsulated in an encapsulant and electrically connected to a redistribution structure to form an integrated circuit package (also referred to as a semiconductor package). Each of the dies in the package may be known good dies (KGD's), which have passed one or more chip probe (CP) tests. The first die (e.g., an application processor (AP)) may be hybrid bonded to the second die (e.g., memory). By hybrid bonding the first die and the second die, a thickness of the bonded structure can be reduced, and the bonded structure may be packaged within other components (e.g., other dies and/or redistribution structures) at a greater density. Further, embodiment packages may also include through vias extending from the stacked dies through the encapsulant. The through vias may be thermally conductive (e.g., providing heat dissipation through the package). Further, the through vias may or may not provide electrical connection to the stacked dies. Various embodiment packages may provide one or more of the following non-limiting advantages: cost savings by employing KGD's to detect faulty chips prior to packaging, thereby improving yield and reducing waste and/or cost; improved thermal dissipation; providing multi-die stacking of homogenous or heterogeneous die types and/or die sizes; increased flexibility in die stacking; improved signal transmission performance; and integration into wafer-to-wafer bonding processes and/or other processes for manufacturing ease and cost savings.

In accordance with an embodiment, a device package includes a first die directly bonded to a second die at an interface, wherein the interface comprises a conductor-to-conductor bond; an encapsulant surrounding the first die and the second die; a plurality of through vias extending through the encapsulant, wherein the plurality of through vias are disposed adjacent the first die and the second die; a plurality of thermal vias extending through the encapsulant, wherein the plurality of thermal vias are disposed on a surface of the second die and adjacent the first die; and a redistribution structure electrically connected to the first die, the second die, and the plurality of through vias. In an embodiment, the first die further comprises: a semiconductor substrate, wherein a dielectric layer of the second die is directly bonded to the semiconductor substrate at the interface; and a through substrate via extending through the semiconductor substrate, wherein a contact pad of the second die is directly bonded to the through substrate via at the interface. In an embodiment, the through substrate via electrically connects the second die to the redistribution structure. In an embodiment, a dielectric layer of the first die is directly connected to a dielectric layer of the second die at the interface, and wherein a contact pad of the first die is directly connected to a contact pad of the second die at the interface. In an embodiment, the first die comprises a through via extending through a semiconductor substrate, wherein the through via extends higher than the semiconductor substrate. In an embodiment, the device package further includes a passivating dielectric layer disposed over the second die and along sidewalls of the first die. In an embodiment, the passivating dielectric layer is disposed between a bottom surface of the plurality of thermal vias and a top surface of the second die. In an embodiment, the device package further includes a contact pad on the through via and the passivating dielectric layer, wherein the contact pad electrically connects the through via to the redistribution structure. In an embodiment, the plurality of thermal vias is electrically isolated from any active devices in the first die and the second die. In an embodiment, the plurality of thermal vias is electrically connect to an active device in the first die.

In accordance with an embodiment, a package includes a first die bonded to a second die, wherein a backside of the first die is directly bonded to a front side of the second die; an encapsulant encapsulating the first die and the second die; a redistribution structure electrically connected to the first die and the second die; a plurality of thermal vias extending from a surface of the first die to a surface of the encapsulant opposite the redistribution structure; and a plurality of through vias extending from the redistribution structure to the surface of the encapsulant opposite the redistribution structure. In an embodiment, the first die comprises: a semiconductor substrate directly bonded to a dielectric layer of the second die; and a through via extending through the semiconductor substrate, wherein a contact pad of the second die is directly bonded to the through via. In an embodiment, each of the plurality of thermal vias comprises a seed layer on the backside of the first die. In an embodiment, the plurality of thermal vias extends past sidewalls of the second die in a planar view. In an embodiment, the plurality of through vias encircles the first die and the second die in a planar view.

In accordance with an embodiment, a method includes hybrid bonding a first die to a second die; depositing a seed layer over and along sidewalls of the first die and the second die; plating a plurality of thermal vias on a surface of the seed layer over the first die; encapsulating the first die, the second die, and the plurality of thermal vias in an encapsulant; planarizing the encapsulant to expose the second die and the plurality of thermal vias; and forming a redistribution structure on an opposing side of the second die as the first die. In an embodiment, the method further includes prior to hybrid bonding the first die to the second die, attaching the first die to a carrier, wherein the seed layer is deposited over the carrier; and plating a plurality of through vias on a surface of the seed layer over the carrier. In an embodiment, hybrid bonding the first die to the second die comprises: directly bonding a dielectric layer of the second die to a semiconductor substrate of the first die; and directly bonding a contact pad in the dielectric layer of the second die to a through via extending through the semiconductor substrate of the first die. In an embodiment, the method further includes prior to forming the redistribution structure, removing the first die and the second die from a first carrier; and attaching a second carrier to a side of the second die opposite the first die. In an embodiment, the method further includes after plating the plurality of thermal vias, removing the seed layer from sidewalls of the first die, sidewalls of the second die, and a top surface of the second die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device package comprising:
   a first die directly bonded to a second die at an interface, wherein the interface comprises a first conductive feature of the first die directly contacting a second conductive feature of the second die;
   a thermal via on a surface of the second die and adjacent to the first die;
   an encapsulant surrounding the first die, the second die, and the thermal via in a top down view;
   a through via extending completely through the encapsulant, wherein a surface area of the through via is different from a surface area of the thermal via in a top-down view; and
   a redistribution structure electrically connected to the first die, the second die, and the through via.

2. The device package of claim 1, wherein the interface further comprises a first dielectric layer of the first die directly contacting a second dielectric layer of the second die.

3. The device package of claim 1, wherein the interface further comprises a first dielectric layer of the first die directly contacting a semiconductor substrate of the second die, and wherein the second conductive feature is a through substrate via extending through the semiconductor substrate.

4. The device package of claim 1, wherein the first die comprises a through via extending through a semiconductor substrate of the first die, wherein the through via extends higher than the semiconductor substrate.

5. The device package of claim 4 further comprising a contact pad on the through via, wherein the contact pad electrically connects the through via to the redistribution structure.

6. The device package of claim 4, wherein the through via is directly connected to the redistribution structure.

7. The device package of claim 1, further comprising a passivating dielectric layer disposed over the second die and along sidewalls of the first die.

8. The device package of claim 7, wherein the passivating dielectric layer is disposed between a bottom surface of the thermal via and a top surface of the second die.

9. The device package of claim 1, wherein the thermal via is electrically isolated from all active devices in the first die and the second die.

10. The device package of claim 1, wherein the thermal via is electrically connect to an active device in the first die.

11. The device package of claim 1, wherein a shape of the through via is different from a shape of the thermal via in the top-down view.

12. A package comprising:
    a first die bonded to a second die, wherein the first die comprises:
       a semiconductor substrate;
       a plurality of first contact pads directly bonded to a plurality of second contact pads of the second die; and
       a plurality of first through via extending through the semiconductor substrate;
    an encapsulant encapsulating the first die and the second die;
    a redistribution structure electrically connected to the first die and the second die;
    a plurality of thermal vias extending from a the second die to the redistribution structure; and
    a plurality of second through vias extending from the redistribution structure to a surface of the encapsulant opposite the redistribution structure.

13. The package of claim 12 further comprising a passivation layer along sidewalls of the first die and on a top surface of the second die, wherein the passivation layer physically separates the plurality of thermal vias from the top surface of the second die.

14. The package of claim 12, wherein the plurality of thermal vias further extend to a third contact pad of the second die.

15. A package comprising:
    a first die directly bonded to a second die with a dielectric-to-dielectric bond;
    a plurality of thermal vias on a top surface of the second die;
    a redistribution structure electrically connected to the first die and the second die; and
    a passivation layer on sidewalls of the first die and the top surface of the second die, the passivation layer being further disposed between a bottom surface of the plurality of thermal vias and the top surface of the second die, the passivation layer electrically insulating the plurality of thermal vias from the first die and the second die.

16. The package of claim 15 further comprising an encapsulant around the first die and on the top surface of the second die, wherein the passivation layer is disposed between the encapsulant and the top surface of the second die.

17. The package of claim 16 further comprising a plurality of through vias extending through the encapsulant, wherein a height of the plurality of through vias in the encapsulant is greater than a height of the plurality of thermal vias in the encapsulant.

18. The package of claim 15, wherein the first die is further directly bonded to the second die with a conductor-to-conductor bond.

19. The package of claim 15, wherein the passivation layer is a conformal layer.

20. The package of claim 15, wherein the plurality of thermal vias extends higher than the first die.

* * * * *